(12) United States Patent
Maeno et al.

(10) Patent No.: US 8,102,514 B2
(45) Date of Patent: Jan. 24, 2012

(54) BEAM IRRADIATION APPARATUS

(75) Inventors: Yoshiaki Maeno, Mizuho (JP); Atsushi Yamaguchi, Mizuho (JP)

(73) Assignees: Sanyo Electric Co., Ltd., Osaka (JP); Sanyo Optec Design Co., Ltd., Tokyo (JP)

( * ) Notice: Subject to any disclaimer, the term of this patent is extended or adjusted under 35 U.S.C. 154(b) by 692 days.

(21) Appl. No.: 12/209,815

(22) Filed: Sep. 12, 2008

(65) Prior Publication Data
US 2009/0103577 A1    Apr. 23, 2009

(30) Foreign Application Priority Data

Sep. 14, 2007  (JP) ................................ 2007-239396
Sep. 25, 2007  (JP) ................................ 2007-247231

(51) Int. Cl.
*G01C 3/08*    (2006.01)

(52) U.S. Cl. ........ 356/3.01; 356/3.1; 356/4.01; 356/4.1; 356/5.01

(58) Field of Classification Search ......... 356/3.01–28.5
See application file for complete search history.

(56) References Cited

U.S. PATENT DOCUMENTS
4,662,750 A * 5/1987 Barger .......................... 356/510

FOREIGN PATENT DOCUMENTS
JP          11-083988 A        3/1999
* cited by examiner

*Primary Examiner* — Thomas Tarcza
*Assistant Examiner* — Luke Ratcliffe
(74) *Attorney, Agent, or Firm* — Ditthavong Mori & Steiner, P.C.

(57) ABSTRACT

A laser beam and a servo beam are incident on a mirror and a transparent member, respectively, so that an angle direction A1 from an optical axis of the laser beam to be incident on the mirror to an incidence plane of the mirror and an angle direction A2 from an optical axis of the servo beam to be incident on the transparent member to an incidence plane of the transparent member are opposite to each other. With such layout of an optical system, scan loci of the servo beam corresponding to respective scan lines become closer to parallel. In the incidence plane and the outgoing plane of the servo beam of the transparent member, fine periodic structures tapered from the incidence plane and the outgoing plane are formed at pitches each equal to or less than a wavelength band of the servo beam. By this periodic structure, reflection of the servo beam on the incidence plane and the outgoing plane is suppressed.

5 Claims, 21 Drawing Sheets

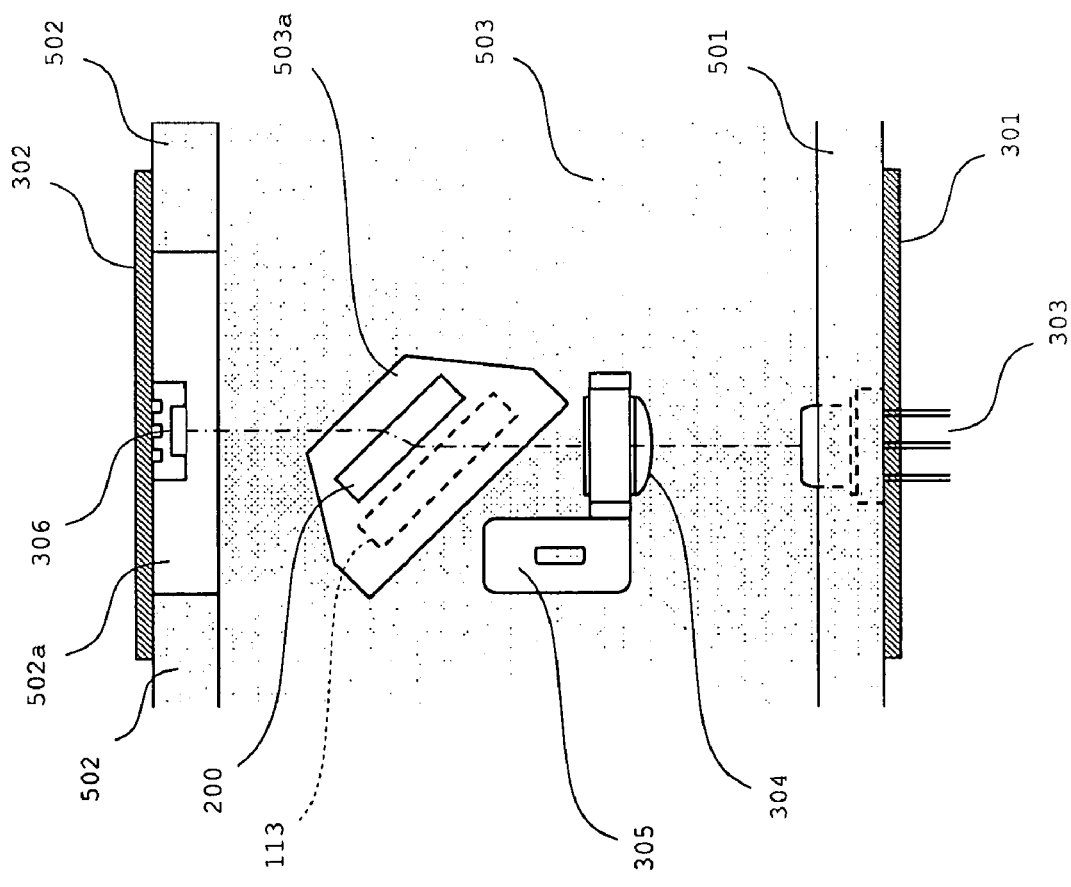
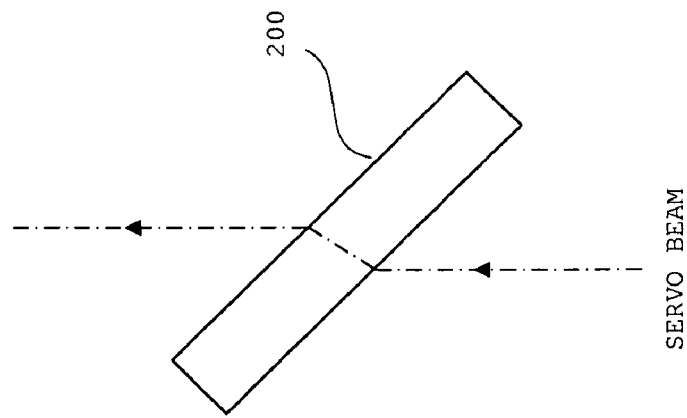
FIG. 3A
FIG. 3B

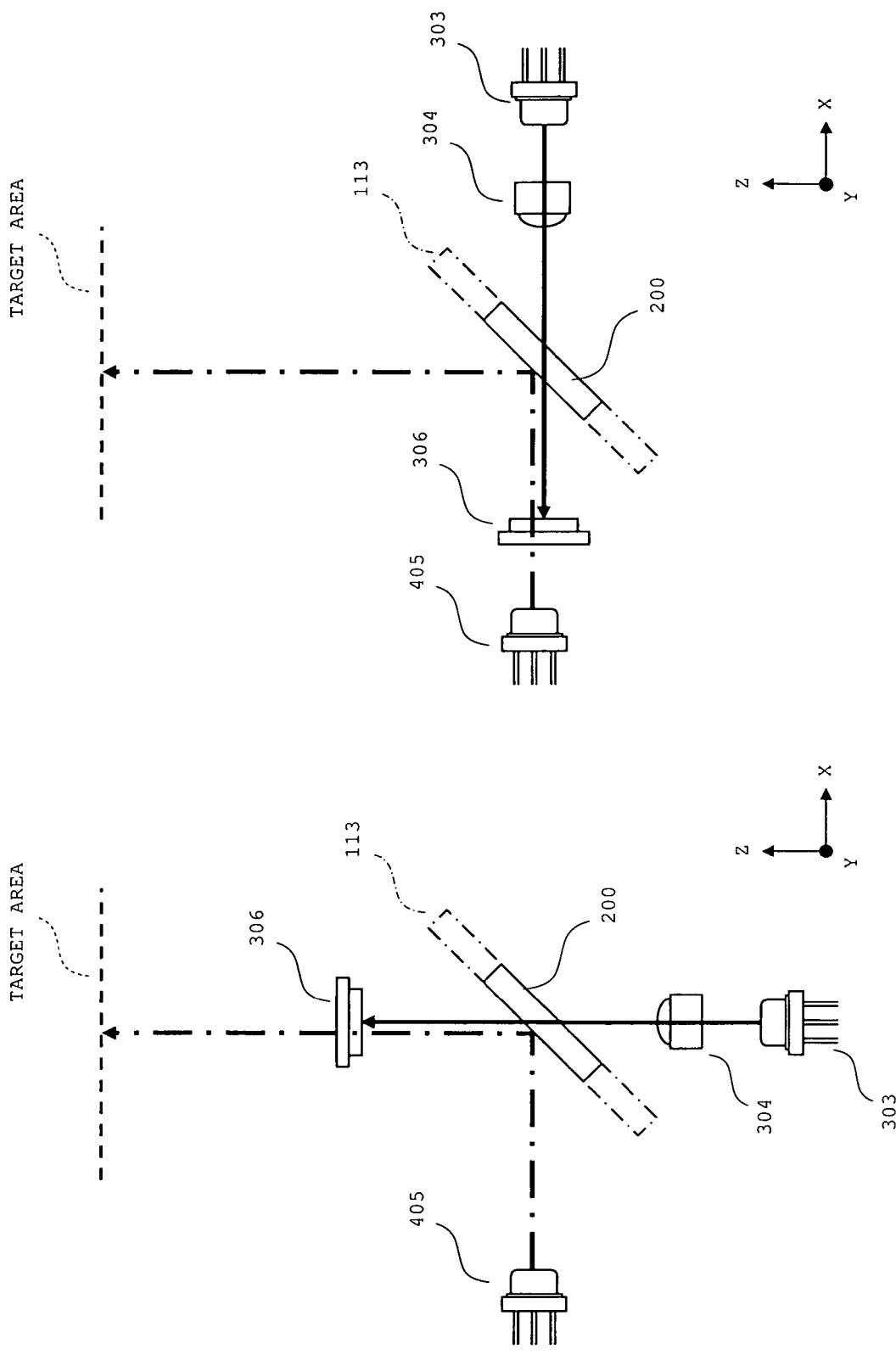

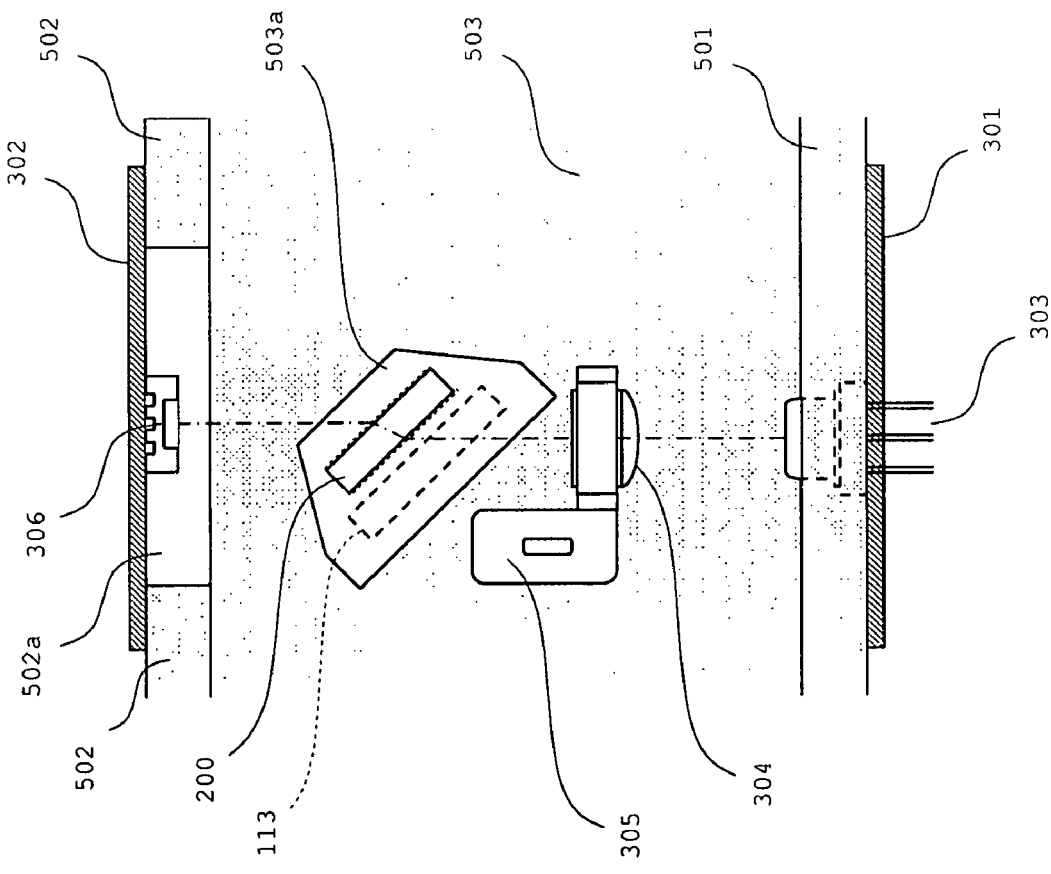

BEAM IRRADIATION APPARATUS

This application claims priority under 35 U.S.C. Section 119 of Japanese Patent Application No. 2007-247231 filed on Sep. 25, 2007, entitled "BEAM IRRADIATION APPARATUS", and Japanese Patent Application No. 2007-239396 filed on Sep. 14, 2007, entitled "BEAM IRRADIATION APPARATUS".

FIELD OF THE INVENTION

The present invention relates to a beam irradiation apparatus for irradiating a target area with a laser beam. More particularly, the present invention is suitable for use in a beam irradiation apparatus mounted on a so-called laser radar for detecting presence or absence of an obstacle in a target area and a distance to an obstacle based on reflection light when the a target area is irradiated with a laser beam.

DESCRIPTION OF THE RELATED ART

In recent years, to increase safety at the time of driving, a laser radar is mounted on a household passenger car or the like. The laser radar emits a laser beam to the front in the travel direction and detects presence or absence of an obstacle in a target area and distance to an obstacle based on a state of reflection light of the laser beam. Generally, a laser radar scans a target area with a laser beam, detects presence or absence of an obstacle in each of scan positions based on presence or absence of reflection light in each of the scan positions and, further, detects distance to an obstacle from a scan position based on time from a timing of irradiation of the laser beam in the scan position to a timing of reception of reflection light.

To increase the detection precision of the laser radar, it is necessary to properly perform a scan with a laser beam in a target area, and properly detect the position of the scan with the laser beam. As a laser beam scan mechanism, a scan mechanism using a polygon mirror and a scan mechanism of a lens drive type of driving a lens for scan two-dimensionally are known.

As a new scan mechanism different from those scan mechanisms, a mirror-turning-type scan mechanism can be used. In the new scan mechanism, a mirror is supported so as to be driven by two axes. The mirror is turned around each of the drive shafts as axes by electromagnetic driving force generated between a coil and magnet. A laser beam is obliquely incident on the mirror and reflection light travels toward the target area. By two-dimensionally driving the mirror around the drive shafts as axes, the target area is scanned in two-dimensional directions with the laser beam.

In the scan mechanism, the scan position of the laser beam in the target area corresponds to the turn position of the mirror in a one-to-one corresponding manner. The scan position of the laser beam can be therefore detected by detecting the turn position of the mirror. The turn position of the mirror can be detected by, for example, detecting the turn position of another member which turns with the mirror.

FIGS. 21A and 21B are diagrams showing an example of a configuration for detecting the turn position of the mirror. FIG. 21A shows an example of a configuration in a case of using a transparent member in a parallel plate shape as another member. FIG. 21B shows an example of a configuration in a case of using a mirror as another member.

Shown in FIG. 21A are a semiconductor laser 601, a transparent member 602, and a photodetector (position sensing device (PSD)) 603. A laser beam (servo beam) emitted from the semiconductor laser 601 is refracted by the transparent member 602 disposed so as to be tilted with respect to the laser beam axis, and is received by the photodetector 603. When the transparent member 602 turns as shown by the arrow, the path of the servo beam changes as shown by a dotted line in the diagram, and the servo beam reception position on the photodetector 603 changes. Therefore, from the servo beam reception position detected by the photodetector 603, the turn position of the transparent member 602 can be detected.

Shown in FIG. 21B are a semiconductor laser 611, a mirror 612, and a photodetector (PSD) 613. The laser beam (servo beam) emitted from the semiconductor laser 611 is reflected by the mirror 612 disposed so as to be tilted with respect to the laser beam axis and the reflection light is received by the photodetector 613. When the mirror 612 turns as shown by the arrow, the path of the servo beam changes as shown by a dotted line in the diagram, and the servo beam reception position on the photodetector 613 changes. Therefore, from the servo beam reception position detected by the photodetector 613, the turn position of the mirror 612 can be detected.

When the mirror 612 turns only by an angle $\alpha$ as shown in FIG. 21B, a deflection angle of the servo beam reflected by the mirror 612 is $2\alpha$. Consequently, the light reception plane of the photodetector 613 which receives the reflection light is relatively large. In contrast, when the transparent member 602 is used as shown in FIG. 21A, even when the transparent member 602 turns, the deflection width of the servo beam passed through the transparent member 602 does not increase so much. Therefore, as compared with the case of FIG. 21B, the light reception plane of the photodetector 603 can be made much smaller, and the cost of the photodetector can be suppressed.

Generally, the laser radar scans a target area with a laser beam horizontally. A plurality of scan lines in the horizontal direction are set in the vertical direction. Consequently, in a scan line in a position deviated in the vertical direction from the center of the target are, a scan has to be performed with a laser beam in the horizontal direction in a state where the laser beam is shifted in the vertical direction only by a predetermined angle (angle according to a target scan line) from the horizontal direction.

In the above described mirror-turning-type scan mechanism, however, when the mirror is turned in the horizontal direction using one of the axes as a turn axis in a state where the mirror is fixed in the vertical direction using the other axis as a stationary axis, the scan locus of the laser beam in the target area does not become horizontal but is tilted from the horizon. Consequently, in the scan mechanism, the mirror has to be turned simultaneously around two axes so that the scan locus becomes horizontal in the scan operation on the scan lines.

When the configuration of FIG. 21A is used as a configuration for detecting the turn position of the mirror, a plurality of servo beam scan loci appear on the photodetector in correspondence with the scan lines on the target area. In this case, however, the scan loci of the servo beam on the photodetector 603 do not become parallel with each other depending on the disposing position of the semiconductor laser 601 but, for example, become tilted with each other as shown in FIG. 7. Consequently, to properly detect the mirror turn position, a computing process according to the tilt angle has to be performed on a detection signal from the photodetector 603 on the scan locus unit basis. A problem occurs such that it makes the process complicated.

In the configuration of FIG. 21A, when the transparent member 602 turns with the turn of the mirror, the ratio of light reflected by the laser beam incident plane and light reflected by the outgoing plane changes. Due to this, the amount of the laser beam received by the photodetector 603 changes with the turn of the transparent member 602, and it causes an error in the position detection signal output from the photodetector 603. The error exerts an influence on the detection precision of the laser beam scan position in the target area.

SUMMARY OF THE INVENTION

A first object of the present invention is to provide a beam irradiation apparatus capable of properly detecting a mirror turn position by a simple computing process. A second object of the present invention is to provide a beam irradiation apparatus capable of properly detecting a scan position of a laser beam in a target area.

To achieve the first object, a beam irradiation apparatus according to a first aspect of the present invention includes: a laser light source for emitting a laser beam; a mirror on which the laser beam emitted from the laser light source is incident; an actuator for turning the mirror in first and second directions using a first shaft and a second shaft perpendicular to the first shaft, respectively, as turn axes; a photorefractive element which is disposed in the actuator and turns in the first and second directions as the mirror turns; a servo beam source for emitting a servo beam to the photorefractive element; and a photodetector for receiving the servo beam refracted by the photorefractive element and outputting a signal according to a light reception position. The laser beam and the servo beam are incident on the mirror and the photorefractive element so that an angle direction from an optical axis of the laser beam to be incident on the mirror to an incidence plane of the mirror and an angle direction from an optical axis of the servo beam to be incident on the photorefractive element to an incidence plane of the photorefractive element are opposite to each other.

In the beam irradiation apparatus according to the first aspect, the scan loci of the servo beam on the photodetector when the plurality of scan lines in the target area are scanned with the laser beam horizontally can be made parallel to each other. Therefore, also in a case of performing a process on approximation that the scan loci are parallel to each other, a mirror turn position can be properly detected.

To achieve the second object, a beam irradiation apparatus according to a second aspect of the present invention includes: an optical element which is turned in a predetermined direction to change a travel direction of a laser beam; an actuator for turning the optical element in the direction; a photorefractive element disposed in the actuator and turning as the optical element turns; a servo beam source for emitting a servo beam to the photorefractive element; andaphotodetector for receiving the servo beam refracted by the photorefractive element and outputting a signal according to a light reception position. Periodic structures are formed at pitches each equal to or less than a wavelength band of the servo beam in at least one of an incidence plane and an outgoing plane of the servo beam of the photorefractive element.

In the beam irradiation apparatus according to the second aspect, reflection of the servo beam is suppressed by the fine periodic structures. Consequently, even when the photorefractive element turns as the optical element turns, a large change does not occur in the light reception amount of the servo beam. Therefore, an error in the position detection signal output from the photodetector can be suppressed, and the scan position of the laser beam in the target area can be detected with precision.

It is desirable to form the periodic structures so that the change does not occur in the intensity of the laser beam passed through the photorefractive element in the range of the deflection angle of the optical element (equal to the deflection angle of the photorefractive element) at the time of irradiating the target area with a beam. Concretely, it is desirable to form the periodic structures at an aspect ratio (=height of periodic structures/pitch of periodic structures) at which angle dependence on the incidence angle of the laser beam hardly occurs in the light transmission characteristic of the periodic structure in the range of the deflection angle.

BRIEF DESCRIPTION OF THE DRAWINGS

The above and other objects and novel features of the present invention will become more apparent by the following description of embodiments in conjunction with the attached drawings.

FIGS. 3A and 3B are diagrams showing a part of the optical system of the beam irradiation apparatus in the first embodiment;

FIGS. 5A and 5B show optical systems of an example and a comparative example related to verification 1 of the first embodiment;

FIGS. 13A and 13B are diagrams illustrating a part of an optical system of a beam irradiation apparatus in a second embodiment;

The drawings are provided for description and do not limit the scope of the present invention.

DESCRIPTION OF PREFERRED EMBODIMENTS

Embodiments of the present invention will be described below with reference to the drawings. A mirror actuator of the following embodiment can be mounted on an in-vehicle laser radar.

First Embodiment

Figure 1B:
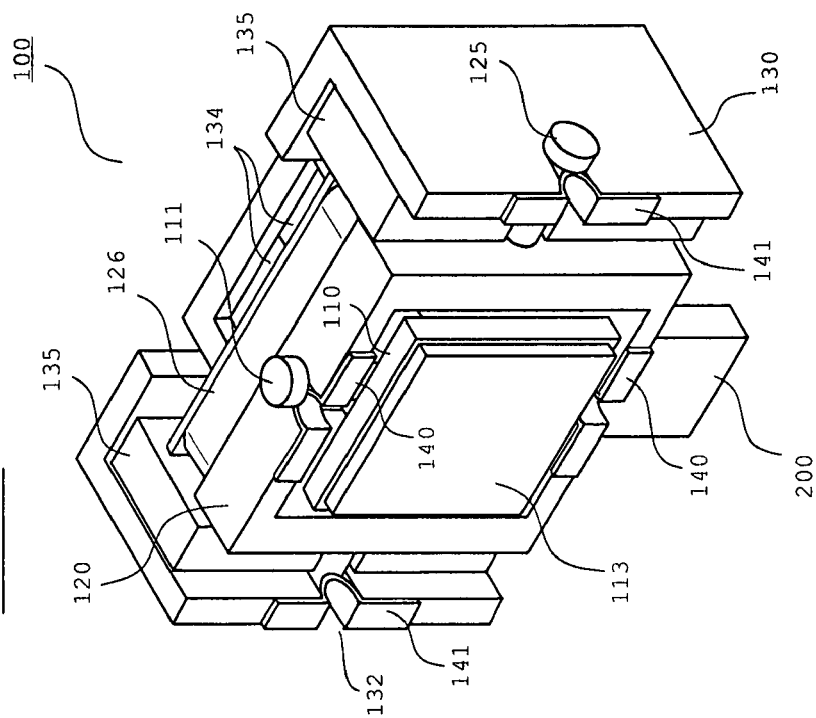
FIGS. 1A and 1B show the configuration of a mirror actuator in a first embodiment.
Figure 1A:
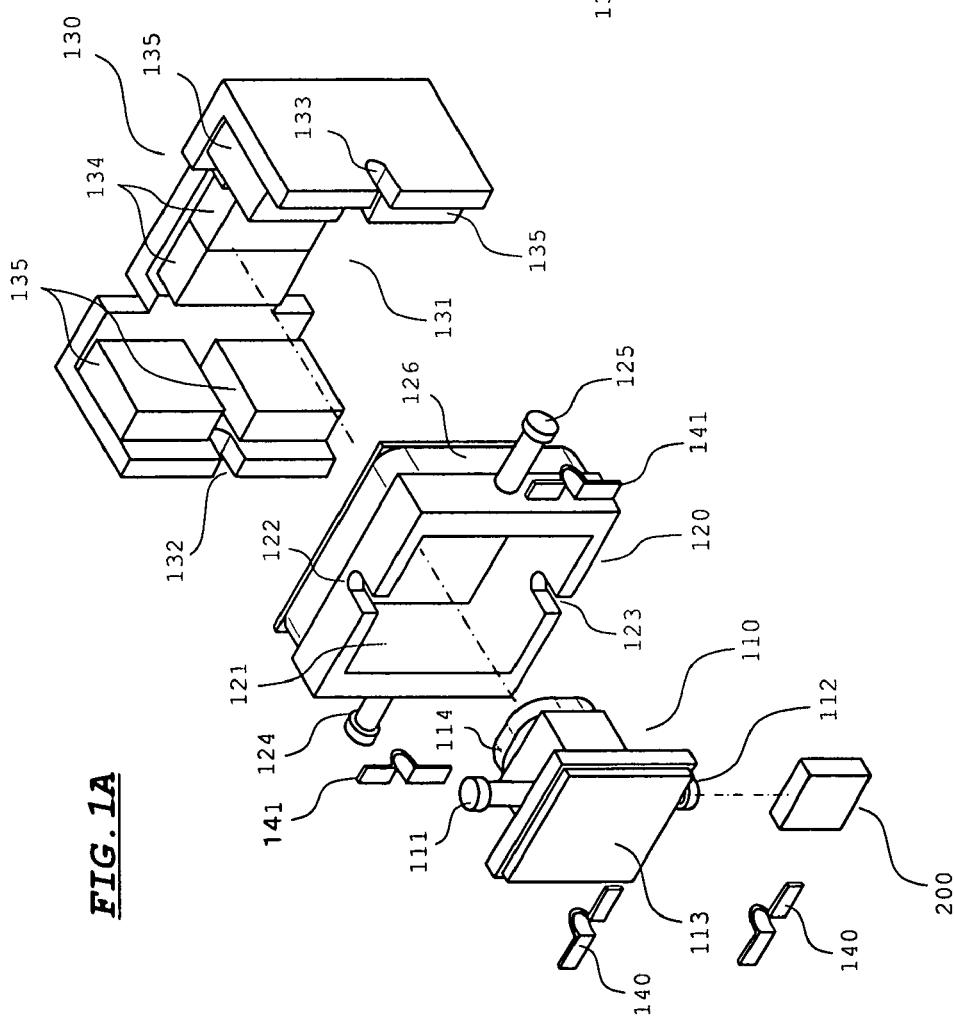

FIGS. 1A and 1B show the configuration of a mirror actuator 100 of a first embodiment. FIG. 1A is an exploded perspective view of the mirror actuator 100. FIG. 1B is a perspective view of the mirror actuator 100 in an assembled state.

In FIG. 1A, there is shown a mirror holder 110. In the mirror holder 110, spindles 111 and 112 each having a retainer at an end are formed. A plate-shaped mirror 113 is attached to the front face of the mirror holder 110, and a coil 114 is attached to the back face. The coil 114 is wound in a square shape.

A parallel-plate-shaped transparent member 200 is attached to the spindle 112. The transparent member 200 is attached to the spindle 112 so that two flat planes are parallel to mirror surfaces of the mirror 113.

A movable frame 120 supports the mirror holder 110 so that the mirror holder 110 can turn about the spindles 111 and 112 as axes. In the movable frame 120, an opening 121 for housing the mirror holder 110 is formed and grooves 122 and 123 in which the spindles 111 and 112 engage are also formed. Further, spindles 124 and 125 each having a retainer at its end are formed in side faces of the movable frame 120, and a coil 126 is attached to the back. The coil 126 is wound in a square shape.

A stationary frame 130 supports the movable frame 120 so as to be turnable around the spindles 124 and 125 as axes. A recess 131 for housing the movable frame 120 is formed in the stationary frame 130. Grooves 132 and 133 in which the spindles 124 and 125 engage are also formed. To the inner face of the stationary frame 130, magnets 134 for applying a magnetic field to the coil 114 and magnets 135 for applying a magnetic field to the coil 126 are attached. Each of the grooves 132 and 133 extends from the front face of the stationary frame 130 to the gap between the upper and lower two magnets 135.

Plate springs 140 press the spindles 111 and 112 from the front so that the spindles 111 and 112 of the mirror holder 110 do not drop from the grooves 122 and 123 in the movable frame 120. Plate springs 141 press the spindles 124 and 125 from the front so that the spindles 124 and 125 of the movable frame 120 do not drop from the grooves 132 and 133 in the stationary frame 130.

At the time of assembling the mirror actuator 100, the spindles 111 and 112 of the mirror holder 110 are allowed to engage in the grooves 122 and 123 of the movable frame 120 and, further, the plate spring 140 is attached to the front face of the movable frame 120 so as to press the front face of the spindles 111 and 112. As a result, the mirror holder 110 is turnably supported by the movable frame 120.

After attaching the mirror holder 110 to the movable frame 120, the spindles 124 and 125 of the movable frame 120 are allowed to engage in the grooves 132 and 133 in the stationary frame 130 and, further, the plate spring 141 is attached to the front face of the stationary frame 130 so as to press the front face of the spindles 132 and 133. The movable frame 120 is turnably attached to the stationary frame 130, thereby completing assembly of the mirror actuator 100.

When the mirror holder 110 turns in the movable frame 120 around the spindles 111 and 112 as axes, the mirror 113 turns in association with the turn. When the movable frame 120 turns around the spindles 124 and 125 as axes relative to the stationary frame 130, the mirror holder 110 turns accordingly, and the mirror 113 turns integrally with the mirror holder 110. In such a manner, the mirror holder 110 is turnably supported by the spindles 111 and 112 and the spindles 124 and 125 orthogonal to each other, and the mirror 113 turns around the two axes as the mirror holder 110 turns. The transparent member 200 attached to the spindle 112 also turns as the mirror 113 turns.

In the assembled state shown in FIG. 1B, the two magnets 134 are disposed and their polarities are adjusted so that, by applying current to the coil 114, the turn force using the spindles 111 and 112 as axes is generated in the mirror holder 110. Therefore, when current is applied to the coil 114, the mirror holder 110 turns using the spindles 111 and 112 as axes by the electromagnetic driving force generated in the coil 114 and, with the turn, the transparent member 200 turns.

In the assembled state shown in FIG. 1B, the two magnets 135 are disposed and their polarities are adjusted so that, by applying current to the coil 126, the turn force using the spindles 124 and 125 as axes is generated in the movable frame 120. Therefore, when current is applied to the coil 126, the movable frame 120 turns using the spindles 124 and 125 as axes by the electromagnetic driving force generated in the coil 126 and, with the turn, the transparent member 200 turns.

Figure 2:
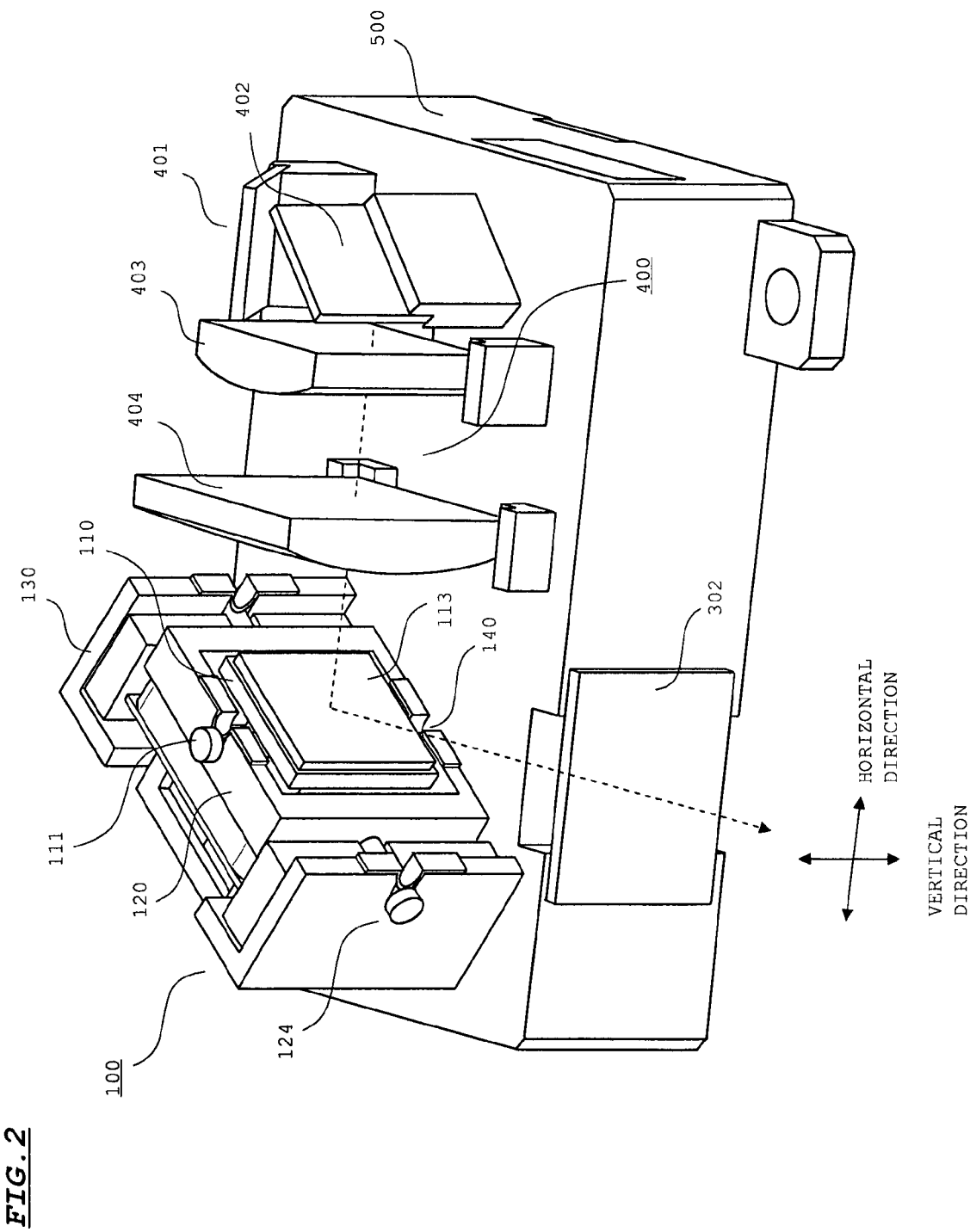
FIG. 2 shows an optical system of a beam irradiation apparatus in the first embodiment.

FIG. 2 shows the configuration of an optical system in a state where the mirror actuator 100 is attached thereto.

In FIG. 2, there is shown a base 500 for supporting the optical system. In the base 500, an opening (not shown in FIG. 2) is formed in a position where the mirror actuator 100 is mounted. The mirror actuator 100 is attached on the base 500 in such a manner that the transparent member 200 is inserted in the opening.

On the top face of the base 500, an optical system 400 for guiding a laser beam to the mirror 113 is attached. The optical system 400 includes two mirrors 401 and 402, beam shaping lenses 403 and 404, and a semiconductor laser (not shown in FIG. 2).

A laser beam emitted upward from the semiconductor laser (not shown) is reflected to the horizontal direction by the mirror 401 and, further, the travel direction of the laser beam is deflected to the horizontal direction by 90 degrees by the mirror 402. After that, the laser beam is subjected to action of convergence in the horizontal direction and the vertical direction by the lenses 403 and 404, respectively. The lens face of each of the lenses 403 and 404 is designed so that the beam shape in a target area (which is set, for example, in a forward position apart from the beam outgoing port of the beam irradiation apparatus by 150 meters) has a predetermined size (for example, a length of about 2 meters and a width of about 1 meter).

A laser beam passed through the lenses 403 and 404 is incident on the mirror 113 of the mirror actuator 100 and is reflected by the mirror 113 toward the target area. The mirror 113 is turned around the two axes by the mirror actuator 100 to scan the target area two-dimensionally with a laser beam.

The mirror actuator 100 is disposed so that the laser beam from the lens 404 enters the mirror surface of the mirror 113 at an incident angle of 45 degrees in the horizontal direction when the mirror 113 is in a neutral position. The "neutral position" refers to the position of the mirror 113 when the mirror surface is parallel to the vertical direction and the laser beam enters the mirror surface at an incidence angle of 45 degrees in the horizontal direction.

FIG. 3A is a partial plan view when the base 500 is seen from the back side. FIG. 3A shows a portion around the position where the mirror actuator 100 is attached in the back side of the base 500.

As shown in the diagram, walls 501 and 502 are formed at the periphery of the back side of the base 500, and a plane 503 lower than the walls 501 and 502 is formed in the center side of the walls 501 and 502. An opening for attaching the semiconductor laser 303 is formed in the wall 501. A substrate 301 on which the semiconductor laser 303 is attached is attached to the outer face of the wall 501.

On the other hand, a notch 502a is formed in the wall 502. A substrate 302 on which a PSD 306 is attached is attached to the outer face of the wall 502 so that the PSD 306 is fit in the notch 502a.

A condenser lens 304 is attached to the plane 503 on the back side of the base 500 with an attaching piece 305. Further, an opening 503a is formed in the plane 503, and the transparent member 200 attached to the mirror actuator 100 is projected to the back side of the base 500 via the opening 503a. The transparent member 200 is positioned so that two planes are parallel to each other in the vertical direction and tilt by 45 degrees from the outgoing light axis of the semiconductor laser 300 when the mirror 113 of the mirror actuator 100 is in the neutral position.

A laser beam (hereinbelow, called "servo beam") emitted from the semiconductor laser 303 passes through the condenser lens 304, is incident on the transparent member 200, and is subjected to the refraction action by the transparent member 200 as shown in FIG. 3B. After that, the servo beam passed through the transparent member 200 is received by the PSD 306, and a position detection signal according to a light reception position is output from the PSD 306.

Figure 4C:
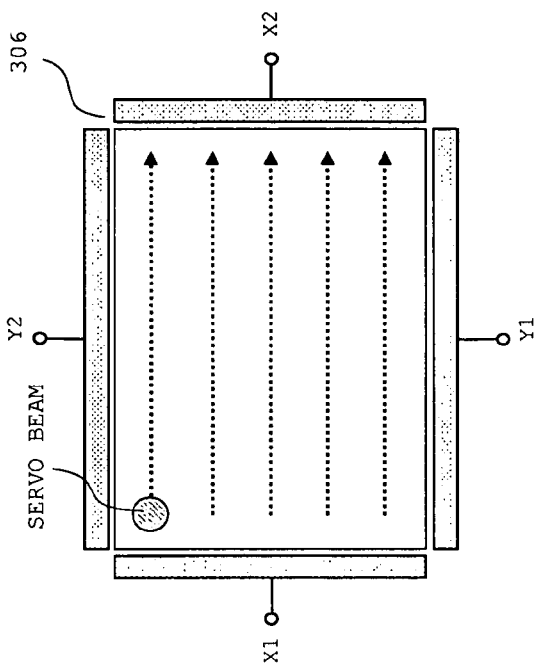
FIGS. 4A to 4C are diagrams showing a scan state of a laser beam and a servo beam in the first embodiment.
Figure 4A:
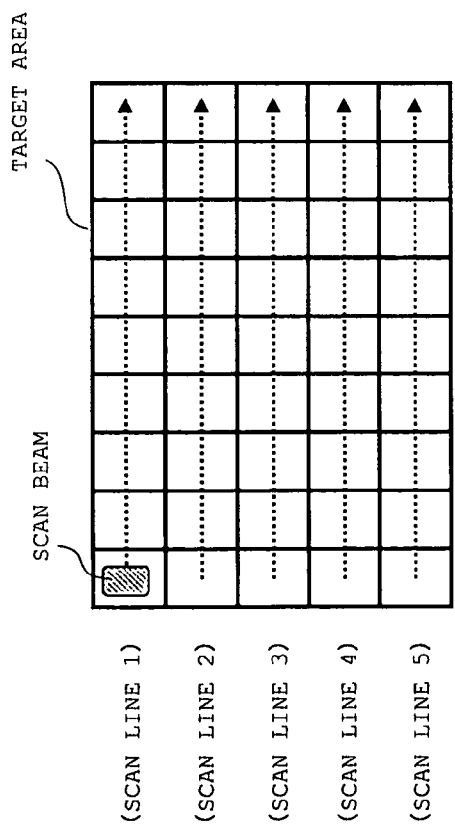
Figure 4B:
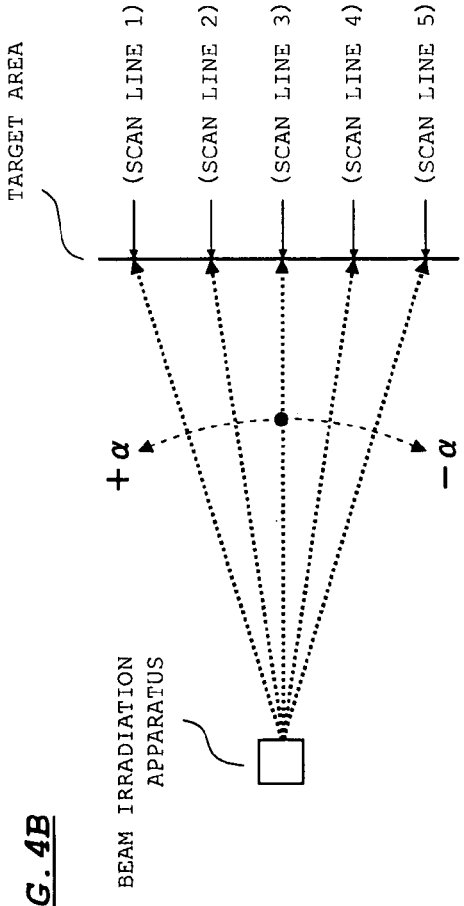

FIGS. 4A to 4C are diagrams showing a laser beam scan state in a target area and a servo beam scan state on the PSD 306.

In the embodiment, as shown in FIG. 4A, the target area is horizontally scanned with the laser beam. Five scan lines in the horizontal direction are set in the vertical direction. Consequently, in four scan lines in positions shifted in the vertical direction from the center of the target area (scan line 3), as shown in FIG. 4B, the scan has to be performed with a laser beam in the horizontal direction in a state where the laser beam is shifted only by a predetermined angle (angle according to the target scan line) from the horizontal direction to the vertical direction (the +α direction or the −α direction).

However, in the mirror actuator of the present embodiment, when the mirror 113 is turned in the horizontal direction using one of the axes (spindles 111 and 112) as a turn axis in a state where the mirror 113 is fixed in the vertical direction using the other axis (spindles 124 and 125) as a stationary axis, the scan locus of the laser beam in the target area does not become horizontal but tilts from the horizon unlike FIG. 4A. Consequently, in the mirror actuator, in the scan operation on the scan lines, the mirror 113 has to be turned in the horizontal direction using the spindles 111 and 112 as a turn axis and, simultaneously, turned in the vertical direction using the spindles 124 and 125 as a turn axis so that the scan locus becomes horizontal.

In the embodiment, the optical axis of the servo beam incident on the transparent member 200 is vertical to the optical axis of the laser beam incident on the mirror 113. As shown in FIG. 4C, the scan loci of the servo beam on the PSD 306 are almost parallel to each other. Five dot-line arrows shown in FIG. 4C show scan loci of the servo beam corresponding to the scan lines in FIG. 4A. Consequently, also in a case of performing a process on approximation that the scan loci are parallel with each other, the mirror turn position can be properly detected.

Verification 1

A verification result (simulation) of the effect of the above-described layout of the optical system will be described below.

FIG. 5A is a diagram showing an optical system of an example of the present invention, and FIG. 5B is a diagram showing an operation system as a comparative example. In FIGS. 5A and 5B, a semiconductor laser 405 emits a laser beam to a target area. Components of the other reference numerals are the same as those of the reference numerals used in the foregoing embodiment.

In the verification, the transparent member 200 was disposed in a position just below the mirror 113. In both of the example and the comparative example, the mirror 113 and the transparent member 200 were disposed so that a laser beam and a servo beam enter the incident plane at a tilt of 45 degrees in a neutral position. In the example of FIG. 5A, in a manner similar to the foregoing embodiment, the optical axis of the servo beam which is incident on the transparent member 200 and that of the laser beam which is incident on the mirror 113 were set so as to be perpendicular to each other. In contrast, in the comparative example of FIG. 5B, the semiconductor laser 303 and the PSD 306 were disposed so that the servo beam enters the transparent member 200 from the Z axis direction, and the optical axis of the servo beam which is incident on the transparent member 200 and that of the laser beam which is incident on the mirror 113 were set so as to be parallel to each other.

The other simulation parameters were set as follows.
a. wavelength of a servo beam: 650 nm
b. refractive index of transparent member: 1.5
c. thickness of transparent member: 3 mm With the parameters, the scan loci of the servo beam on the PSD 306 were obtained by simulation on assumption that each of the scan lines in FIG. 4A was scanned with the laser beam in the horizontal direction within the range of +22.5 degrees from the middle point of the scan line. It was assumed that the optical axis of the laser beam in the scan line 3 in the center is horizontal, the optical axis of the laser beam tilts by 2.5 degrees in each of the +α direction and the −α direction in FIG. 4B from the horizon in the scan lines 2 and 4, and the optical axis of the laser beam tilts by 5 degrees in each of the +α direction and the −α direction in FIG. 4B from the horizon in the scan lines 1 and 5.

Figure 6:
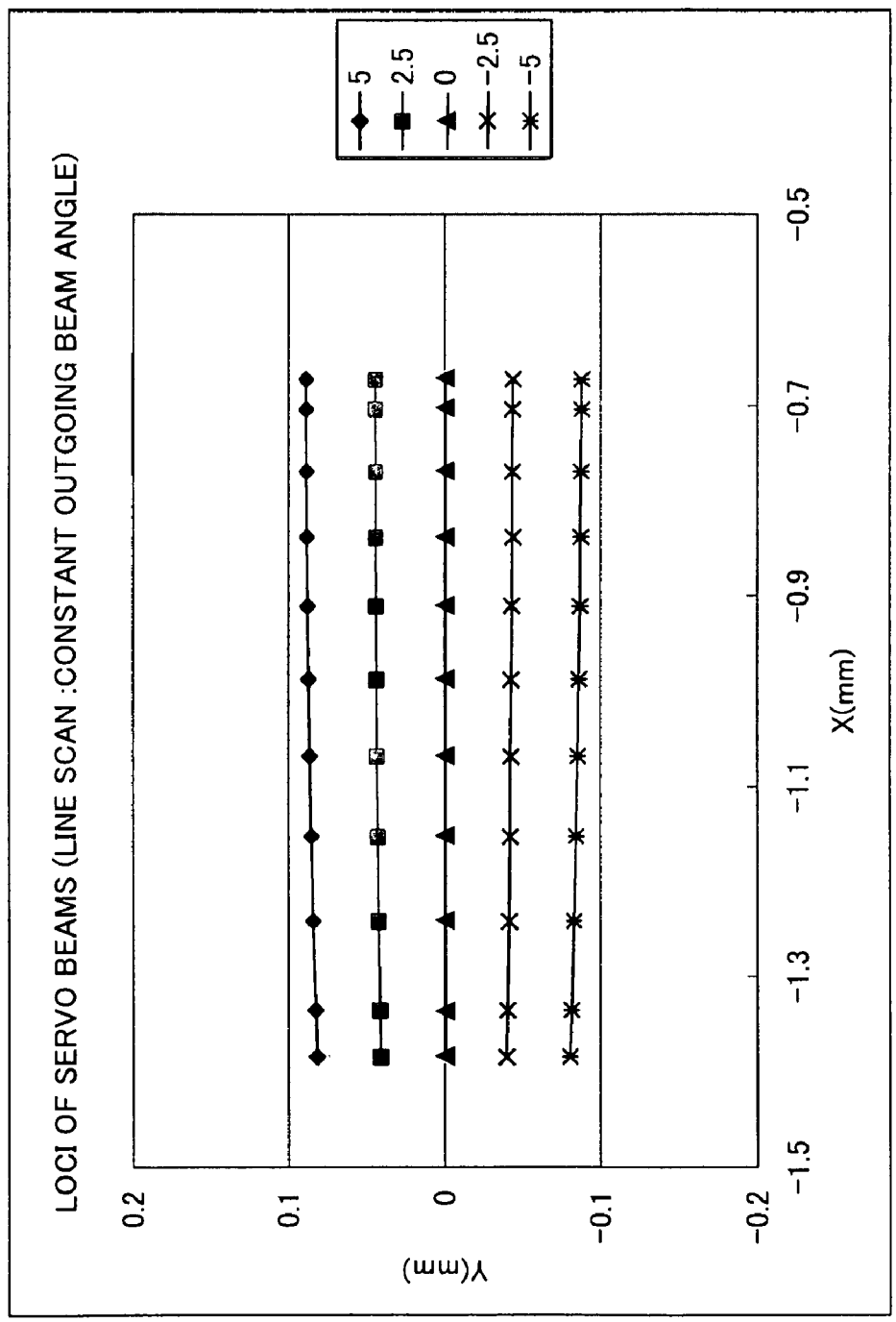
FIG. 6 shows a verification result of the example related to the verification 1.
Figure 7:
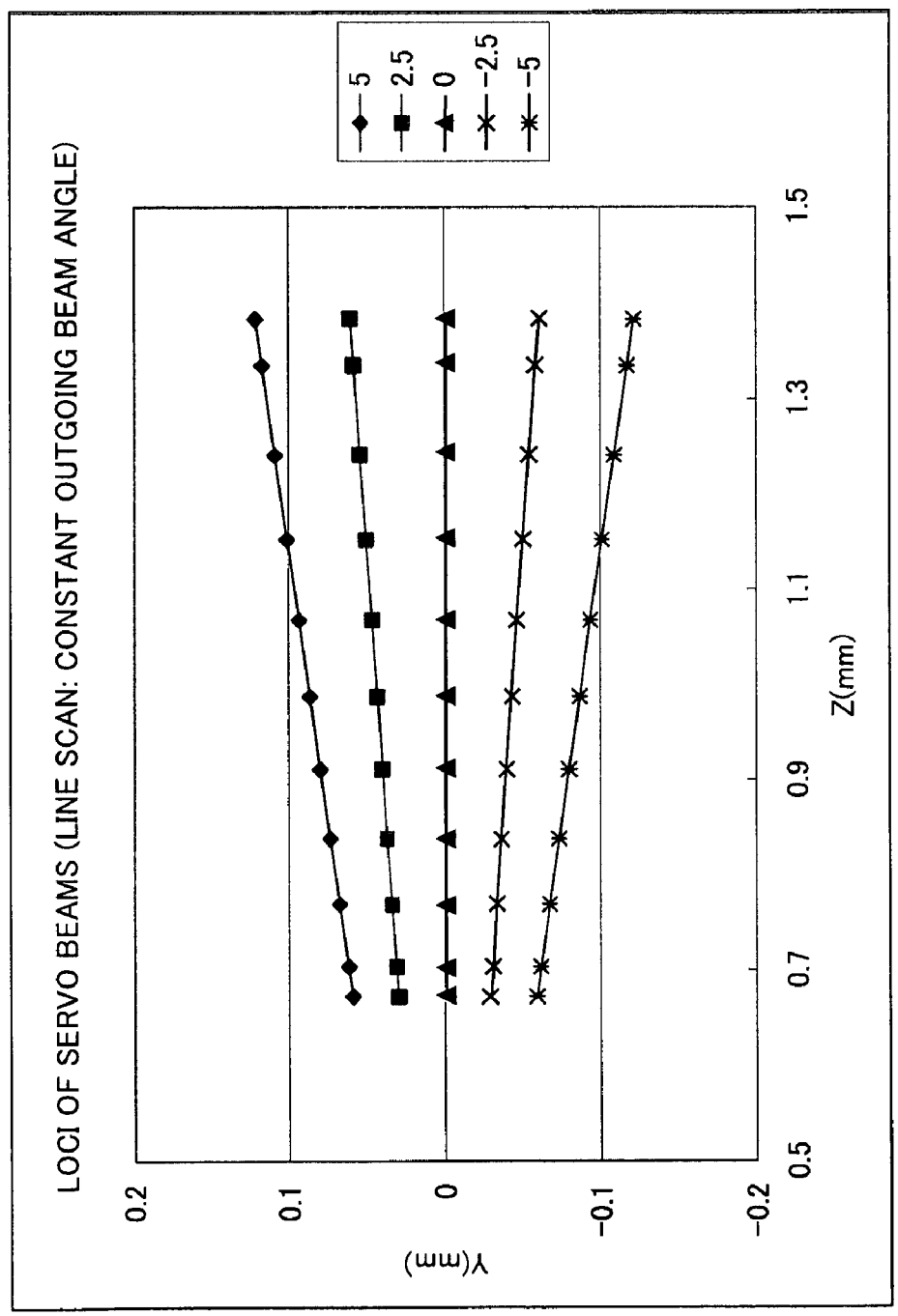
FIG. 7 shows a verification result of the comparative example related to the verification 1.

FIG. 6 is a diagram showing a simulation result of the example. FIG. 7 is a diagram showing a simulation result of the comparative example. In the diagram, lines shown as "5", "2.5", "0", "−2.5", and "−5" indicate scan loci of the servo beam on the PSD 306 when scans are performed with a laser beam in a state where the laser beam is shifted only by "5 degrees", "2.5 degrees", "0 degree", "−2.5 degrees", and "−5 degrees" in the vertical direction in the target area. The lines shown as "5", "2.5", "0", "−2.5", and "−5" show the scan loci of the servo beam on the PSD 306 when the scan lines 1, 2, 3, 4, and 5 in FIG. 4A are scanned with the laser beam, respectively.

It is known from FIG. 7 that, in the comparative example, the scan loci of the servo beam on the PSD 306 are not parallel to each other, and the tilt of the scan locus of the servo beam on the PSD 306 increases with distance from the center scan line 3 on the target area.

In contrast, in the example, it is known from FIG. 6 that the scan loci of the servo beams on the PSD 306 are almost parallel to each other, and do not tilt so much even when the scan line on the target area is apart from the center scan line 3 in the vertical direction.

It can be confirmed from the simulation result that, by making the optical axis of the servo beam incident on the transparent member 200 perpendicular to the optical axis of the laser beam incident on the mirror 113, the scan loci of the servo beam on the PSD 306 can be made almost parallel to each other.

Consequently, like the foregoing embodiment, by constructing the optical system so that the optical axis of the servo beam incident on the transparent member 200 is perpendicular to the optical axis of the laser beam incident on the mirror 113, the scan loci of the servo beams on the PSD 306 can be made almost parallel to each other. According to the embodiment, therefore, also in a case where when the scan loci are approximated to be parallel to each other and the process is performed, the turn position of the mirror can be properly detected. Therefore, the turn position of the mirror and the scan position of the laser beam in the target area can be detected properly by the simple process.

Figure 8B:
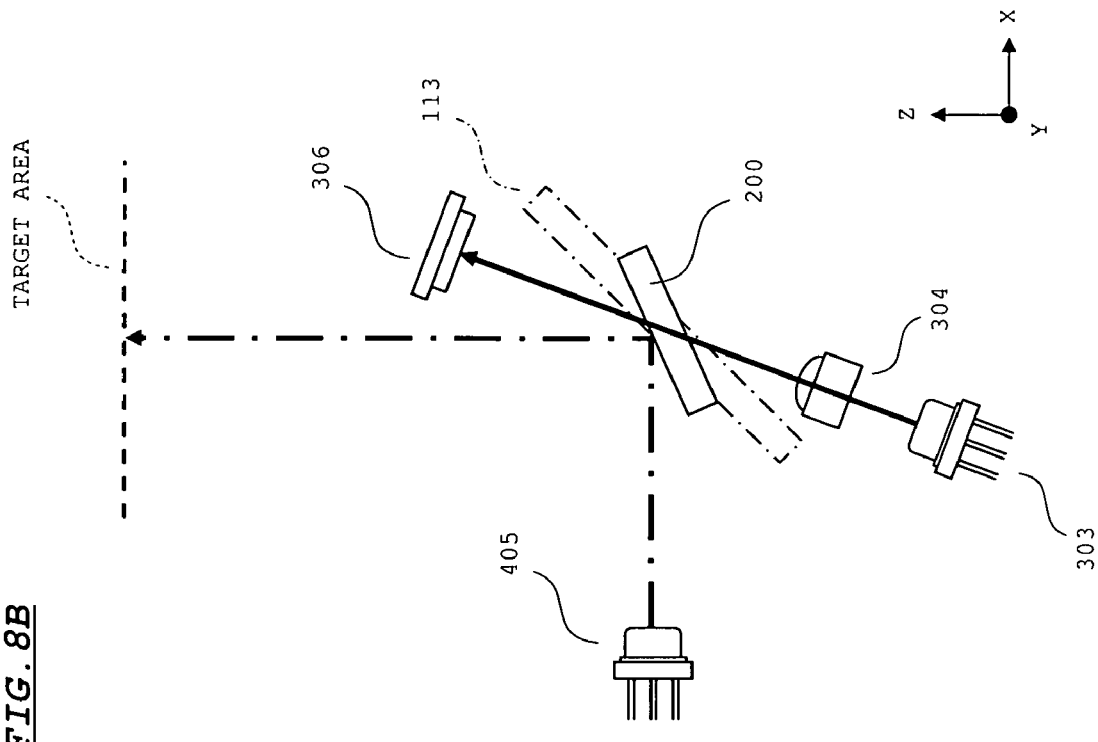
FIGS. 8A and 8B show an example of a change in the servo optical system related to the first embodiment.
Figure 8A:
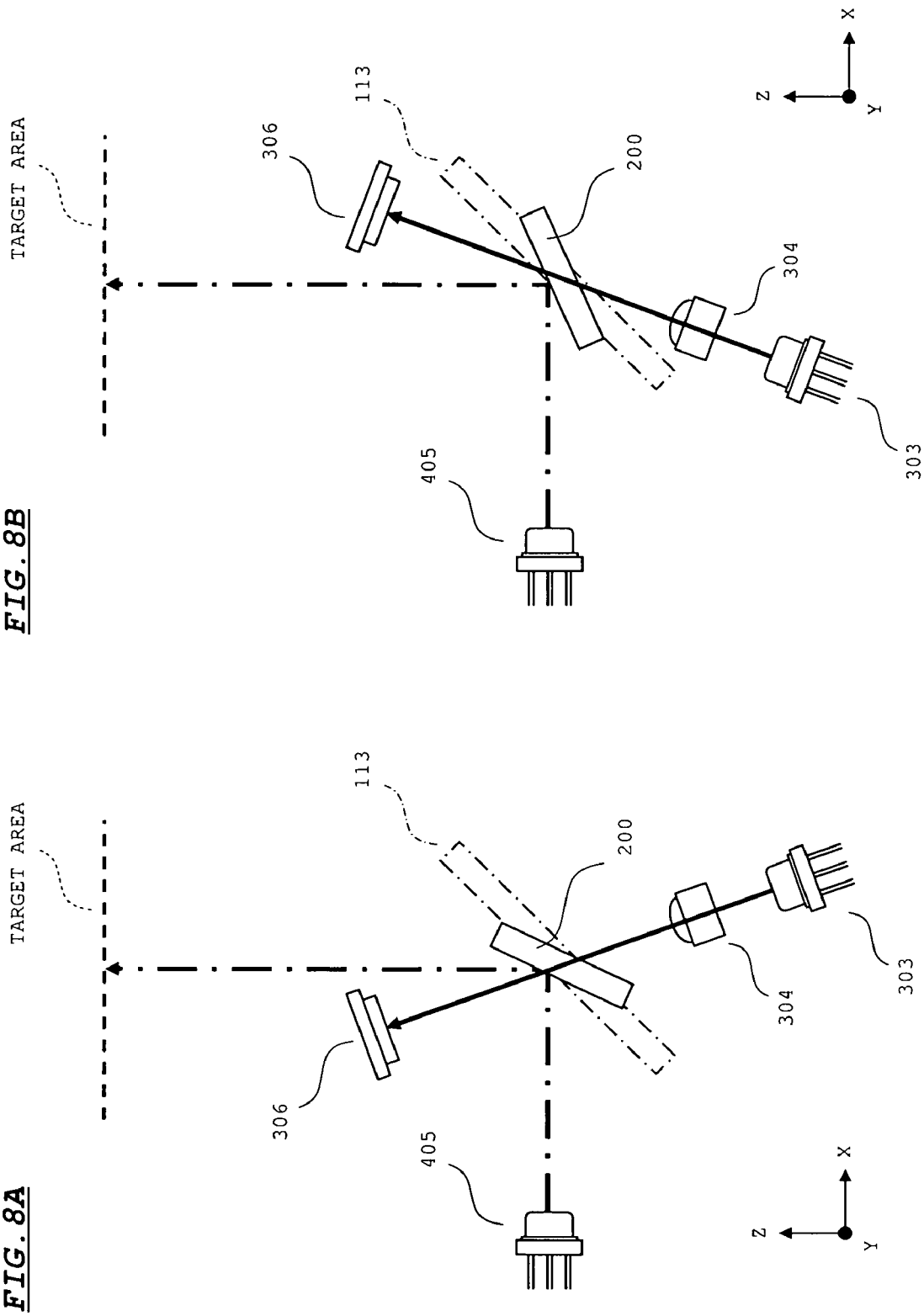

In the foregoing embodiment, the mirror 113 and the transparent member 200 are disposed so as to be parallel to each other. However, as shown in FIGS. 8A and 8B, also in a case where the optical system for servo including the semiconductor laser 303, the condenser lens 304, the transparent member, 200, and the PSD 306 is disposed so as to be turned in the X-Z plane direction and tilt with respect to the mirror 113 while maintaining the positional relations of the optical parts, effects similar to the above-described effects can be obtained. FIGS. 8A and 8B show an example of disposition in a case where the optical system for servo is turned in the counterclockwise direction or clockwise direction.

Verification 2

In the foregoing embodiment, the angle between the optical axis of the servo beam and the incidence plane of the transparent member 200 when the transparent member 200 is in the neutral position is 45 degrees. However, when this angle is changed, the scan locus of the servo beam on the PSD 306 may be changed accordingly.

Figure 9:
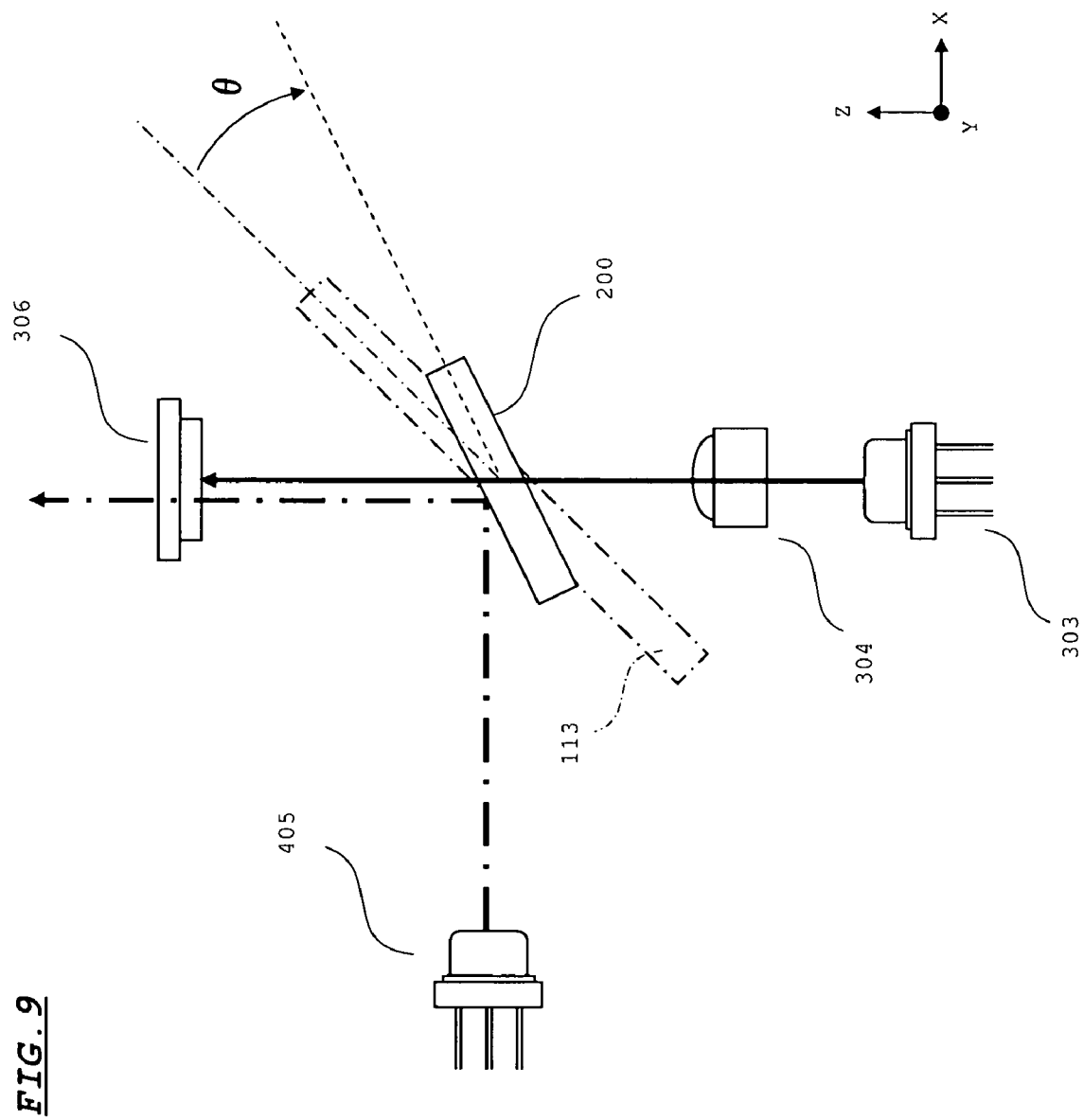
FIG. 9 is a diagram illustrating a turn state of an optical system and a transparent member related to verification 2 in the first embodiment.

The inventors of the present invention therefore obtained, by simulations, changes in the scan loci of the servo beams on the PSD 306 at various turn positions while turning the transparent member 200 in the X-Z plane direction from the initial position (the position parallel to the mirror 113) as shown in FIG. 9 with parameters similar to those of FIG. 5A. The simulation results will be described below.

Figure 10:
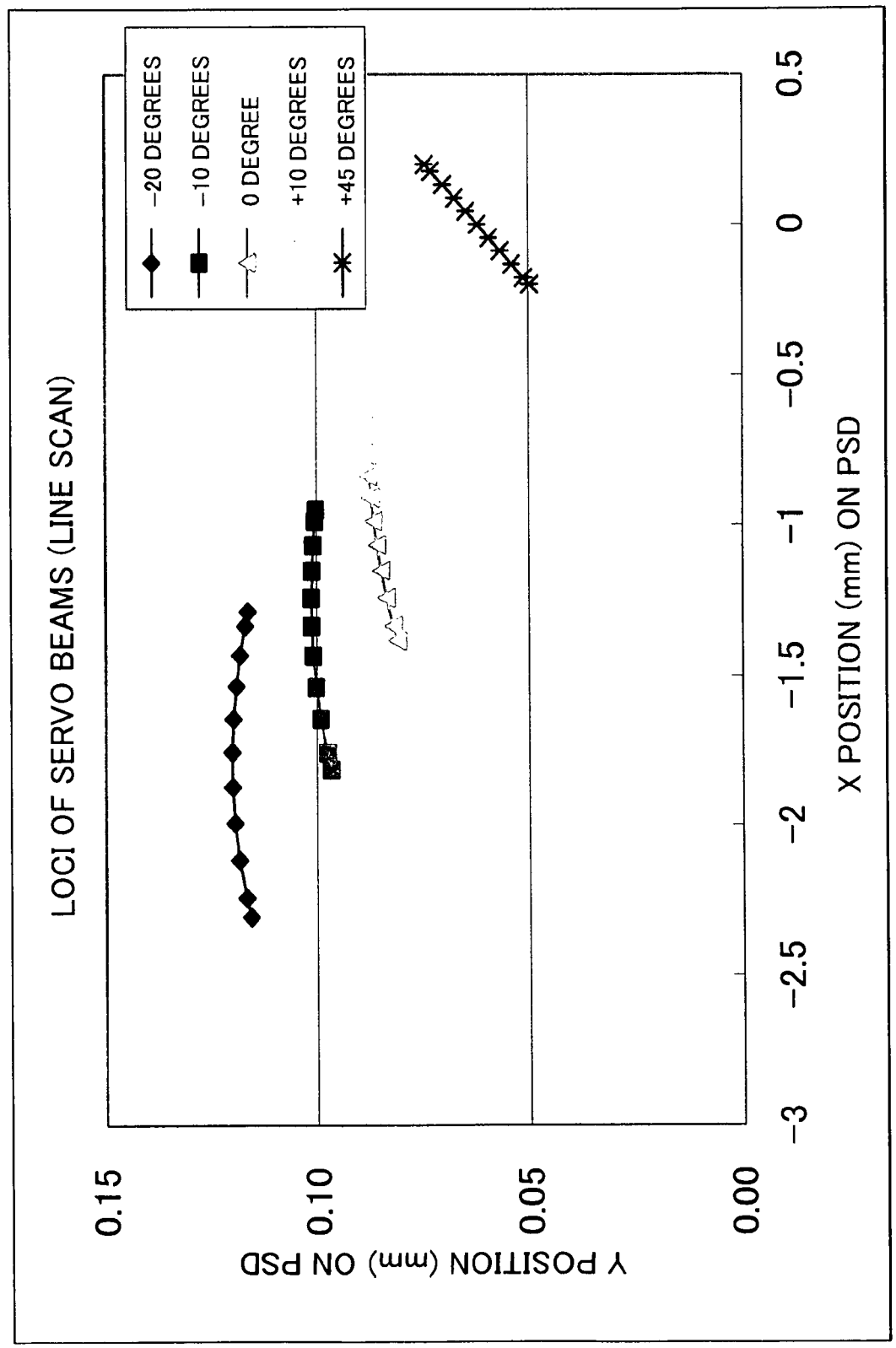
FIG. 10 shows a result of the verification 2.

FIG. 10 shows, as a result of simulation, scan loci of the servo beam on the PSD 306 when the angle θ in FIG. 9 was changed. The clockwise direction in FIG. 9 of the angle θ is set as the positive side, and the counterclockwise direction is set as the negative side. The scan loci at the various angles were obtained when the angle α in FIG. 4 was set to +5 degrees, that is, when the scan line 1 was scanned. The other simulation parameters were set to the same as those in the case of FIG. 5A (verification 1).

It is known from FIG. 10 that, when the transparent member 200 in parallel with the mirror 113 (the line of θ=0 degree in the diagram) is turned in the clockwise direction in FIG. 9, the tilt of the servo beam on the PSD 306 gradually increases. On the other hand, when the transparent member 200 is turned in the counterclockwise direction in FIG. 9, the tilt of the servo beam on the PSD 306 became smaller than that in a case of the initial position. Therefore, it is known from the verification result that, to make the scan loci of the servo beams corresponding to the scan lines more parallel to each other, it is advantageous to turn the transparent member 200 which is in parallel to the mirror 113 in the counterclockwise direction in FIG. 9 so that the angle between the servo beam and the transparent member 200 is made smaller than 45 degrees.

Figure 11:
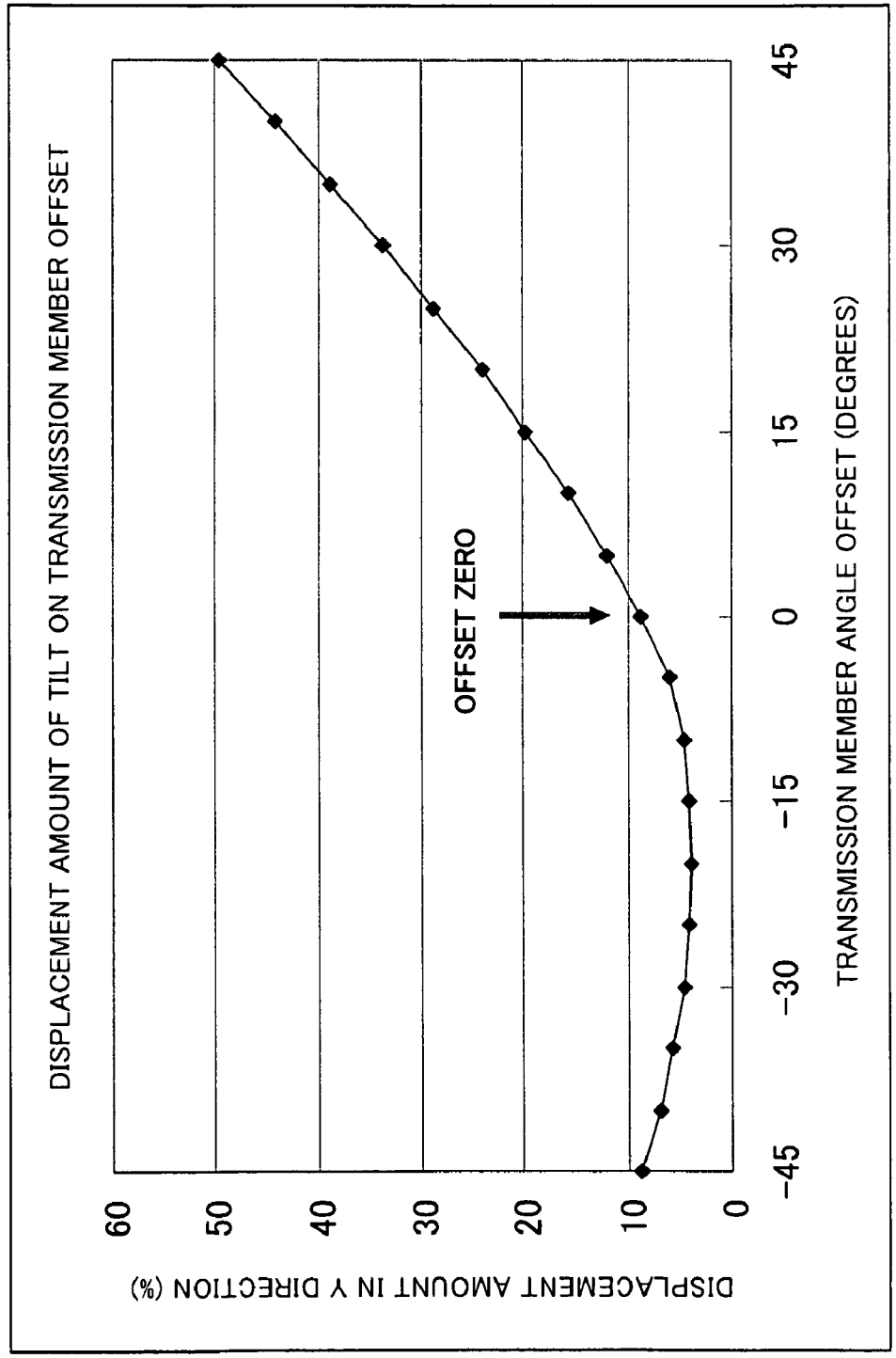
FIG. 11 shows a result of the verification 2.

FIG. 11 shows, as a result of simulation, a displacement amount in the Y direction in the locus of the servo beam on the PSD 306 when the angle θ in FIG. 9 was changed. The displacement amount (vertical axis) was obtained as follows (calculated in percentage).

Displacement amount=(maximum value of position in the Y direction−minimum value of position in the Y direction)/minimum value of position in the Y direction The abscissa axis indicates the angle θ in FIG. 9. The angle θ was set in a manner similar to the above that the clockwise direction is the positive side. The displacement amount at each angle was obtained when the angle α in FIG. 4 was set to +5 degrees, that is, when the scan line 1 was scanned.

It is known from FIG. 11 that the displacement amount increases as the angle θ increases and, therefore, the tilt of the servo beam on the PSD 306 increases. This point coincides with the verification in FIG. 10.

On the other hand, when the angle θ is decreased, the displacement amount gradually decreases until the angle is decreased to an angle after −15 degrees. After that, the displacement amount gradually increases. When the angle θ becomes −45 degrees, the displacement amount becomes almost the same as the initial state (θ=0). To make the scan loci of the servo beams corresponding to the scan lines more parallel to each other, it is therefore preferable to dispose the transparent member 200 so that the angle θ in FIG. 9 becomes about −18 degrees.

The above verification is summarized as follows.

(1) It is understood from the verification result (verification 1) of FIGS. 6 and 7 that in a case where the transparent member 200 and the mirror 113 are parallel to each other, when the optical axis of the servo beam incident on the transparent member 200 and that of the laser beam incident on the mirror 113 are perpendicular to each other, the scan loci of the servo beams corresponding to the scan lines can be made parallel to each other. Also in a case where the servo optical system constructed by the semiconductor laser 303, the condenser lens 304, the transparent member 200, and the PSD 306 is disposed so as to be turned in the X-Z plane direction so as to tilt with respect to the mirror 113 while maintaining the positional relations of the optical parts as shown in FIG. 8, a similar effect is obtained.

Figure 12B:
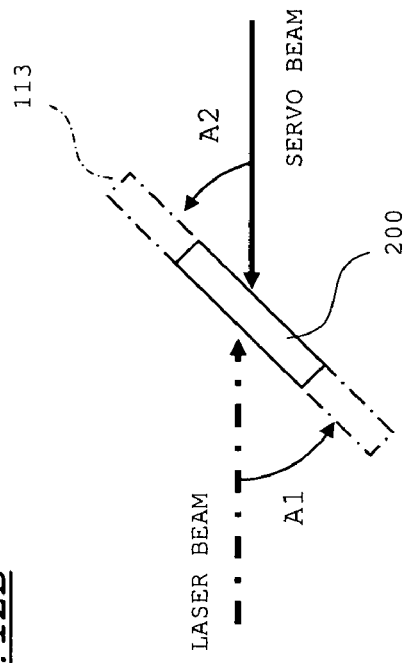
FIG. 12 shows the relation between the laser beam and the servo beam in the first embodiment.
Figure 12D:
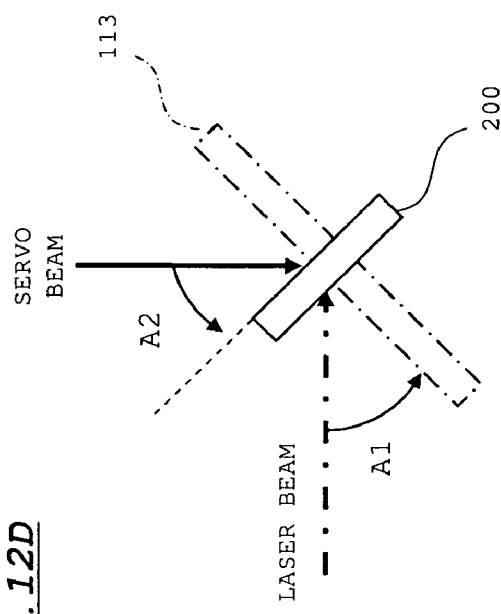
Figure 12A:
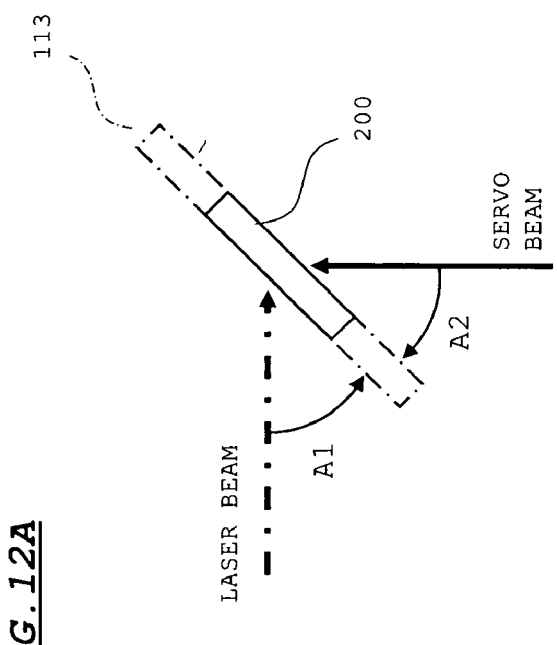
Figure 12C:
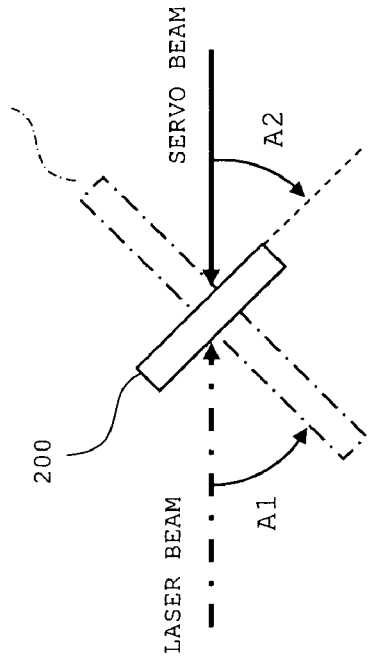

After all, the effect is produced by, as shown in FIGS. 12A and 12C, making the laser beam and the servo beam enter the mirror 113 and the transparent member 200, respectively, so that an angle direction A1 from the optical axis of the laser beam incident on the mirror 113 to the incidence plane of the mirror 113 and an angle direction A2 from the optical axis of the servo beam incident on the transparent member 200 to the incidence plane of the transparent member 200 are opposite to each other.

Specifically, as shown in FIGS. 12B and 12D, when the laser beam and the servo beam are allowed to incident on the mirror 113 and the transparent member 200, respectively, so that the angle direction A1 from the optical axis of the laser beam to the incidence plane of the mirror 113 and the angle direction A2 from the optical axis of the servo beam to the incidence plane of the transparent member 200 become the same direction (in this case, the counterclockwise direction), in a manner similar to the comparative example in the verification 1, the scan loci of the servo beams do not become parallel to each other.

Therefore, to make the scan loci of the servo beams corresponding to the scan lines parallel to each other, as shown in FIGS. 12A and 12C, it is preferable to set the angle direction A1 (counterclockwise direction) and the angle direction A2 (clockwise direction) to be opposite to each other.

(2) It is understood from the verification result (verification 2) of FIGS. 10 and 11, to make the scan loci of the servo beams corresponding to the scan lines more parallel to each other, it is preferable to make the servo beam incident on the transparent member 200 so that the optical axis has a tilt of 45 degrees or less with respect to the incidence plane of the transparent member 200 when the mirror 113 (the transparent member 200) is in the neutral position.

(3) It is understood from the verification result (verification 2) of FIG. 11 that, to make the scan loci of the servo beams corresponding to the scan lines most parallel to each other, it is preferable to make the servo beam incident on the transparent member 200 so that the optical axis has a tilt of about 20 degrees with respect to the incidence plane of the transparent member 200 when the mirror 113 (the transparent member 200) is in the neutral position.

Although the first embodiment of the present invention has been described above, the present invention is not limited to the first embodiment but can be variously modified.

For example, although the semiconductor laser is used as the light source of the servo beam in the foregoing embodiment, an LED (Light Emitting Diode) can be used in place of the semiconductor laser. Although the PSD is used as a photodetector for receiving the servo beam in the foregoing embodiment, as will be described later, a quadrant sensor can be also used as the photodetector.

Second Embodiment

The configuration of a mirror actuator in a second embodiment is the same as that shown in FIGS. 1A and 1B. The configuration of an optical system of a beam irradiation apparatus in the second embodiment is the same as that shown in FIGS. 2 and 3A except for the configuration of the transparent member 200.

FIG. 13A is a partial plane view when the base 500 shown in FIG. 2 is seen from the back side. FIG. 13A shows a part around the position in which the mirror actuator 100 is attached in the back side of the base 500.

In the transparent member 200, as shown in FIG. 13B, fine periodic structures 201 are formed in the incidence plane and the outgoing plane of the servo beam. By the periodic structures 201, reflection of the servo beam in the incidence plane and the outgoing plane of the transparent member 200 is suppressed.

Figure 14B:
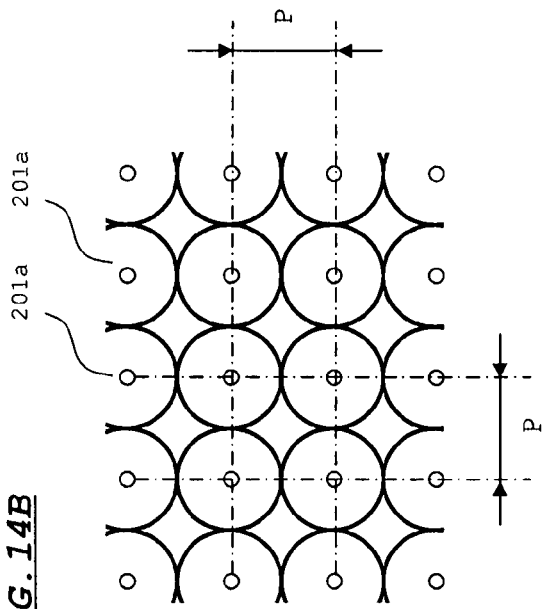
FIGS. 14A to 14C are diagrams illustrating a periodic structure in the second embodiment.
Figure 14C:
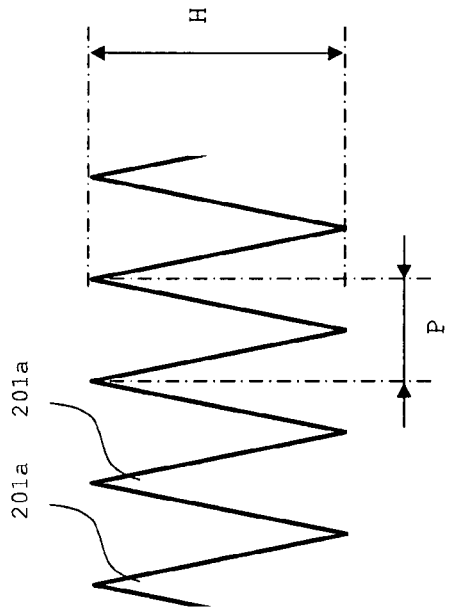
Figure 14A:
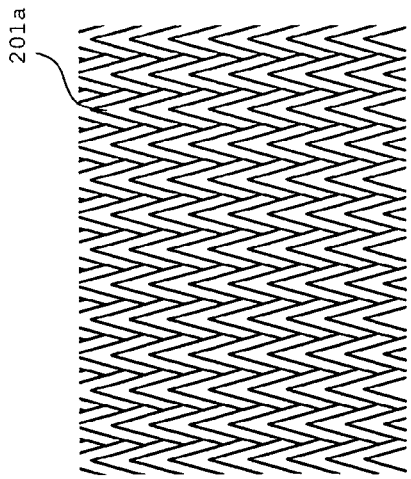

FIGS. 14A to 14C are diagrams schematically showing the periodic structure 201. FIGS. 14A, 14B, and 14C are a perspective view, a plane view, and a side view of the periodic structure 201, respectively.

As shown in the diagram, the periodic structure 201 is formed by disposing projections 201a each in a tapered cone shape having a predetermined height H at predetermined pitches P. In a case where the transparent member 200 is made of a resin material such as polycarbonate or cycloolefin polymer, such a periodic structure 201 can be formed by injection molding using a mold having the periodic structure. Such projections 201a are called a surface non-reflecting structure and formed as a periodic structure having tapered cone projections. The shape of the projection 201a is not limited to the cone as shown in the diagram but may be a pyramid or the like.

In a case where the transparent member 200 is made of glass material other than a resin material, the periodic structure 201 can be formed on the flat face of the transparent member 200 by so-called 2P molding. In such 2P molding, an ultraviolet curable resin is applied on the flat face of the transparent member 200. An ultraviolet ray is emitted in a state where a mold having a periodic structure is pressed against the resin to cure the ultraviolet curable resin. After that, by peeling off the mold from the ultraviolet curable resin, the periodic structure 201 is formed on the flat face of the transparent member 200.

In a case of making the transparent member 200 of a thermoset resin or thermoplastic resin, the periodic structure 201 can be formed on the transparent member 200 by using thermal imprinting.

In a case of forming the periodic structure 201 using an ultraviolet curable resin, to suppress reflection of the servo beam in a border face between the transparent member 200 and the ultraviolet curable resin, an ultraviolet curable resin having a refractive index close to that of the transparent member 200 has to be used.

Figure 15:
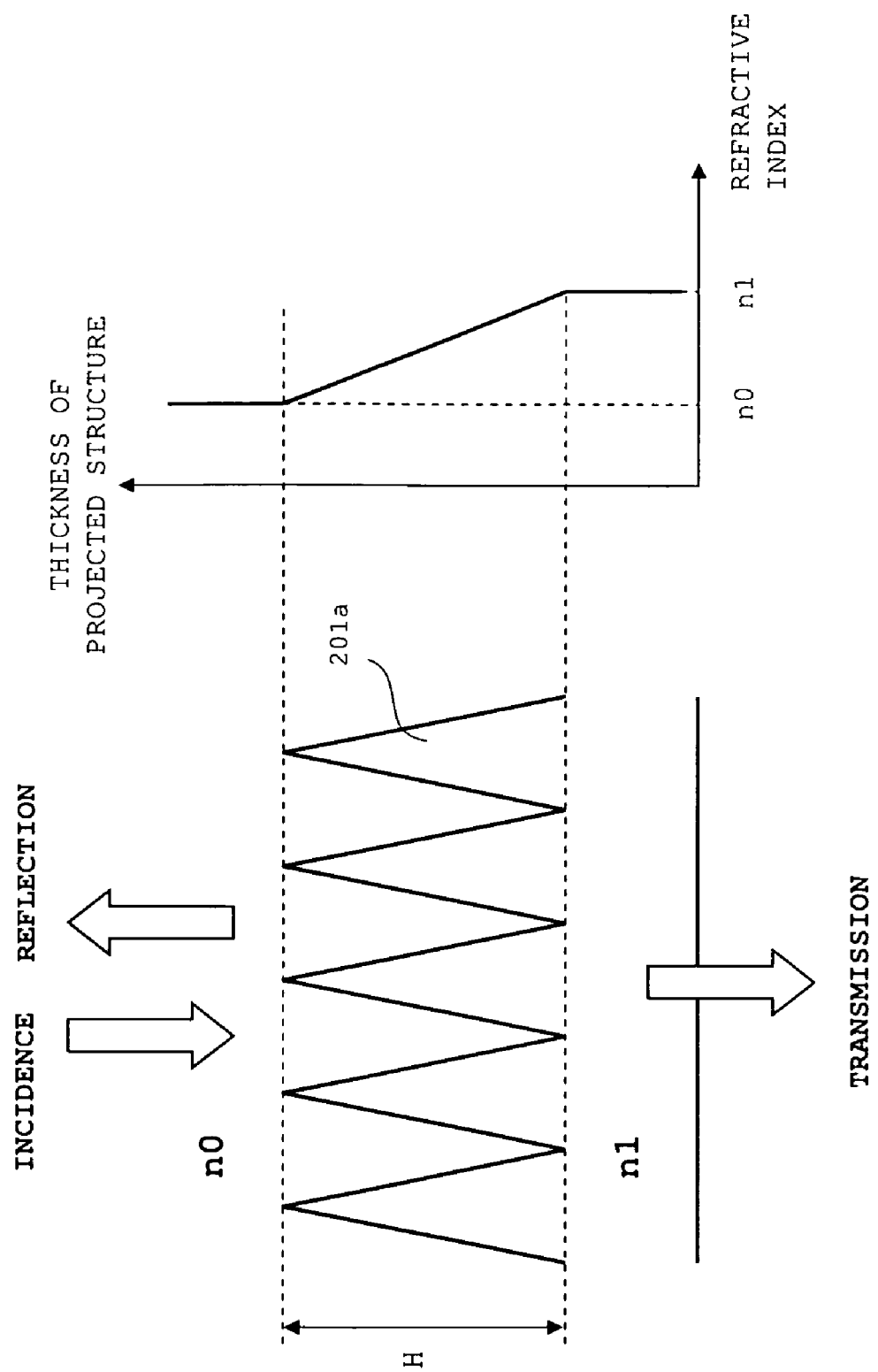
FIG. 15 is a diagram showing the action of the periodic structure in the second embodiment.

FIG. 15 is a diagram showing the relation between the periodic structure 201 and the refractive index. As shown in the diagram, in a case where the periodic structure 201 is formed on a medium having a refractive index n1, the effective refractive index in a light incident medium surface changes gently as if no border of the refractive index exists between two media (having refractive indexes n0 and n1). As a result, the reflectance in the light incidence plane of the medium having the refractive index n1 is suppressed. The phenomenon occurs in a case where the pitch of the periodical structure 201 in the direction of the light incidence plane is smaller than the wavelength of the incident light.

Therefore, when $P \leq \lambda/n$ is set where the pitch of the projections 201a on the periodical structure 201 is P, the refractive index of the material is "n", and the wavelength of the servo beam is $\lambda$, reflection of the servo beam in the incidence plane and the reflection plane of the transparent member 200 can be suppressed. In the embodiment, the pitch P of the periodic structure 201 formed on the incidence plane and the reflection plane of the transparent member 200 is set to be equal to or less than the wavelength of the servo beam.

In the embodiment, the transparent member 200 is disposed so as to tilt with respect to the optical axis of the servo beam, and the tilt angle changes with the turn of the mirror 113. It is consequently necessary to verify how the reflection suppression effect in the periodic structure 201 changes with fluctuations in the tilt angle of the transparent member 200 with respect to the servo beam (angle dependence). In contrast, the inventors of the present invention actually formed the transparent member 200 having the periodic structures 201 in the incident plane and the outgoing plane, and verified the angle dependence. This will be described later with reference to FIG. 19.

As understood from FIG. 15, the higher the height H of the projection 201a is, the more the change in the effective refractive index in the light incidence medium surface becomes gentler, and reflection in the incidence medium surface is suppressed. Therefore, it can be said that the higher the height H of the projection 201a is, the more the fluctuations in the reflection suppression effect caused by the fluctuation in the tilt angle of the transparent member 200 with respect to the servo beam are suppressed. That is, the higher the aspect ratio (=the height H of the periodic structure 201/pitch P of the periodic structure 201) of the periodic structure 201 is, the more fluctuations in the reflection suppression effect caused by fluctuations in the tilt angle of the transparent member 200 can be suppressed.

Figure 16B:
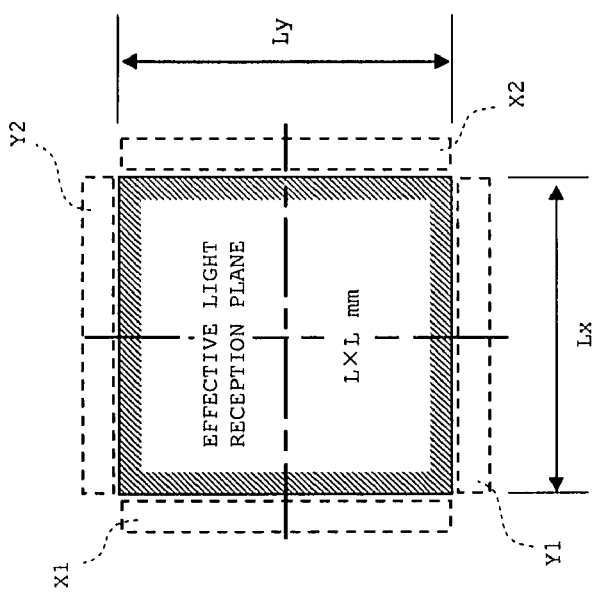
FIGS. 16A and 16B show the configuration of a PSD in the second embodiment.
Figure 16A:
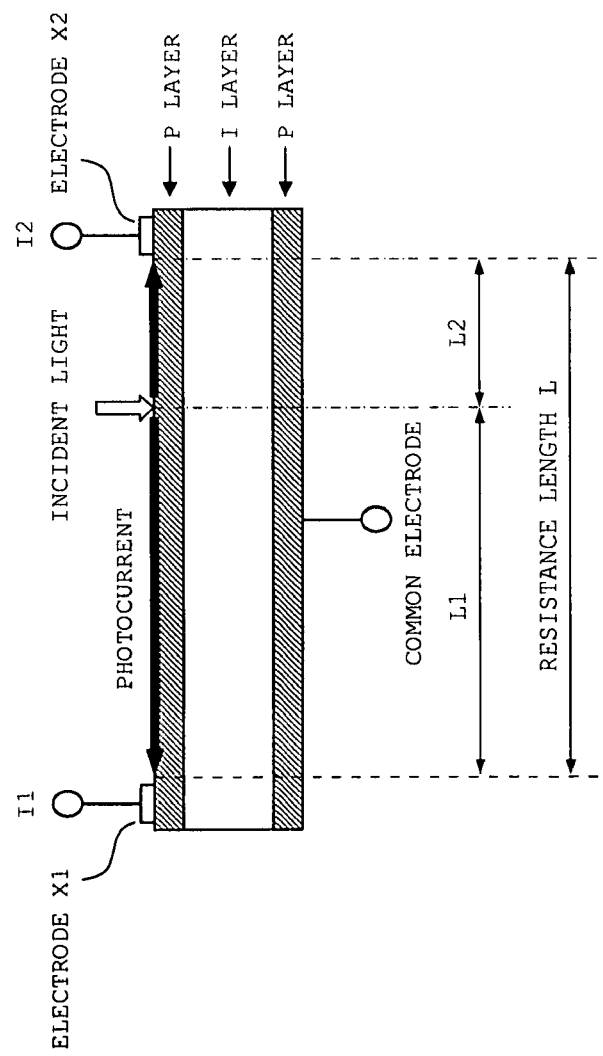

FIG. 16A is a diagram (sectional side view) showing the configuration of the PSD 306, and FIG. 16B is a diagram showing a light reception plane of the PSD 306.

With reference to FIG. 16A, the PSD 306 has a structure in which a P-type resistance layer serving as both the light reception plane and a resistance layer is formed in the surface of an N-type high-resistance silicon substrate. In the resistance layer surface, electrodes X1 and X2 for outputting photoelectric current in the horizontal direction of FIG. 16 and electrodes Y1 and Y2 (which are not shown in FIG. 16A) for outputting photoelectric current in the vertical direction are formed. On the back face, a common electrode is formed.

When the light reception plane is irradiated with a laser beam, charges proportional to the light amount are generated in the irradiation position. The charges reach as photoelectric current the resistance layer and are divided inversely with distance to each of the electrodes. The resultant currents are output from the electrodes X1, X2, Y1, and Y2. Each of the resultant currents output from the electrodes X1, X2, Y1, and Y2 has magnitude obtained by inversely dividing the distance from the irradiation position of the laser beam to the electrodes. Therefore, the light irradiation position on the light reception plane can be detected based on the current values output from the electrodes X1, X2, Y1, and Y2.

Figure 17A:
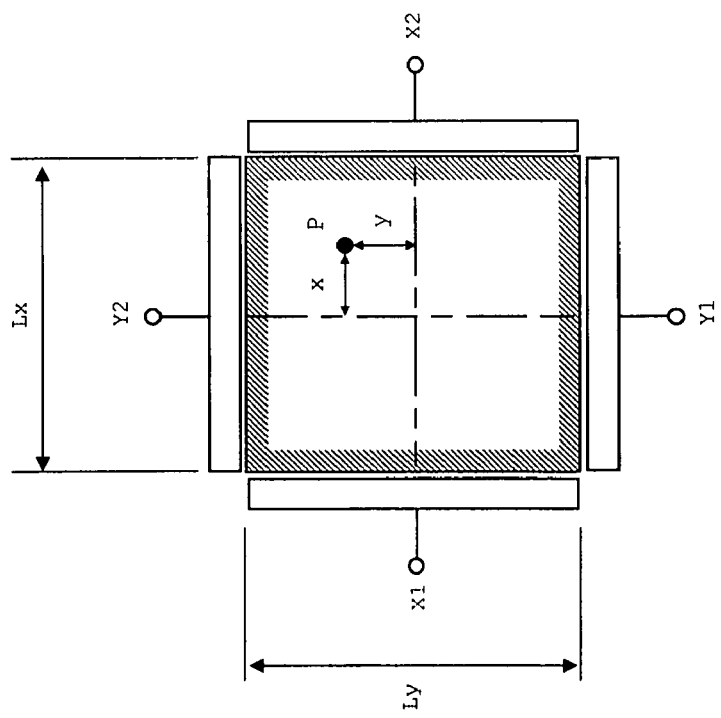
FIGS. 17A and 17B are diagrams illustrating a method of generating a position detection signal in the second embodiment.

For example, it is assumed that a position P in FIG. 17A is irradiated with the servo beam. In this case, when amounts of current output from the electrodes X1, X2, Y1, and Y2 are Ix1, Ix2, Iy1, and Iy2, respectively, and distances between the electrodes in the X direction and the Y direction are Lx and Ly, respectively, the coordinates (x, y) of the position P using the center of the light reception plane as a reference point are calculated by, for example, the following equations.

$$\frac{Ix2 - Ix1}{Ix2 + Ix1} = \frac{2x}{Lx} \quad (1)$$

$$\frac{Iy2 - Iy1}{Iy2 + Iy1} = \frac{2y}{Ly} \quad (2)$$

Figure 17B:
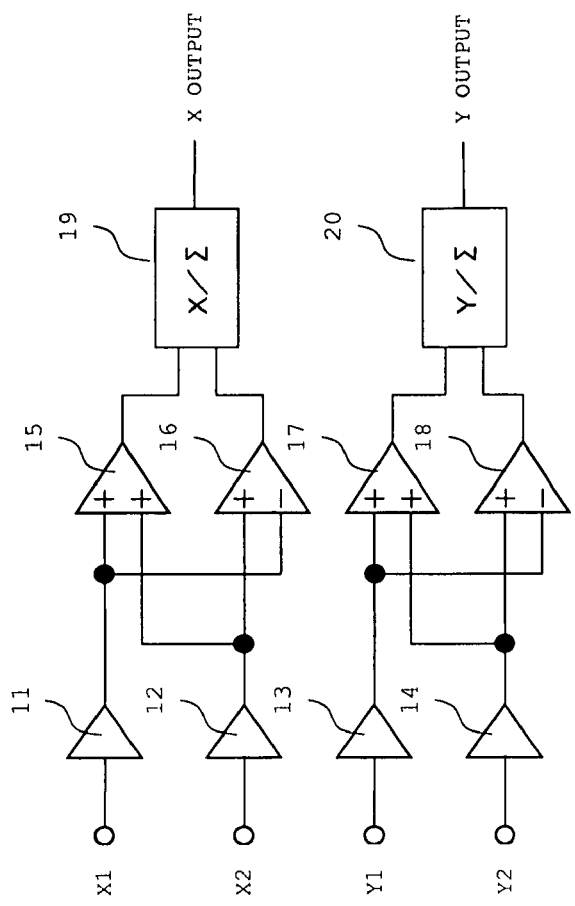

FIG. 17B is a diagram showing the configuration of a computing circuit realizing the calculation equations. The current signals Ix1, Ix2, Iy1, and Iy2 output from the electrodes X1, X2, Y1, and Y2 are amplified by amplifiers 11, 12, 13, and 14, respectively. Addition circuits 15 and 17 perform computation of (Ix2+Ix1) and (Iy2+Iy1), respectively. Subtraction circuits 16 and 18 execute computation of (Ix2−Ix1) and (Ix2−Iy1), respectively. Further, subtraction circuits 19 and 20 execute division on the left side of the equations (1) and (2). From the division circuits 19 and 20, position detection signals indicative of an x-direction position (2x/Lx) and a y-direction position (2y/Ly) in the light reception position P of the servo beam are output.

When the light reception amount of the servo beam in the PSD 306 changes with turn of the transparent member 200 in the calculation, the denominator and the numerator in the left side of each of the equations (1) and (2) change. From the influence, an error is included in position detection signals output from the division circuits 19 and 20. The smaller the change in the light reception amount of the servo beam in the PSD 306 is, the more the error is suppressed.

In the embodiment, as described above, the fine periodic structure 201 is formed in each of the incidence plane and the outgoing plane of the transparent member 200, so that fluctuations in the PSD light reception amount when the transparent member 200 turn are suppressed. Consequently, an error included in the position detection signal can be suppressed conspicuously.

Results of a verification on the effect will be described below.

Verification

Figure 18:
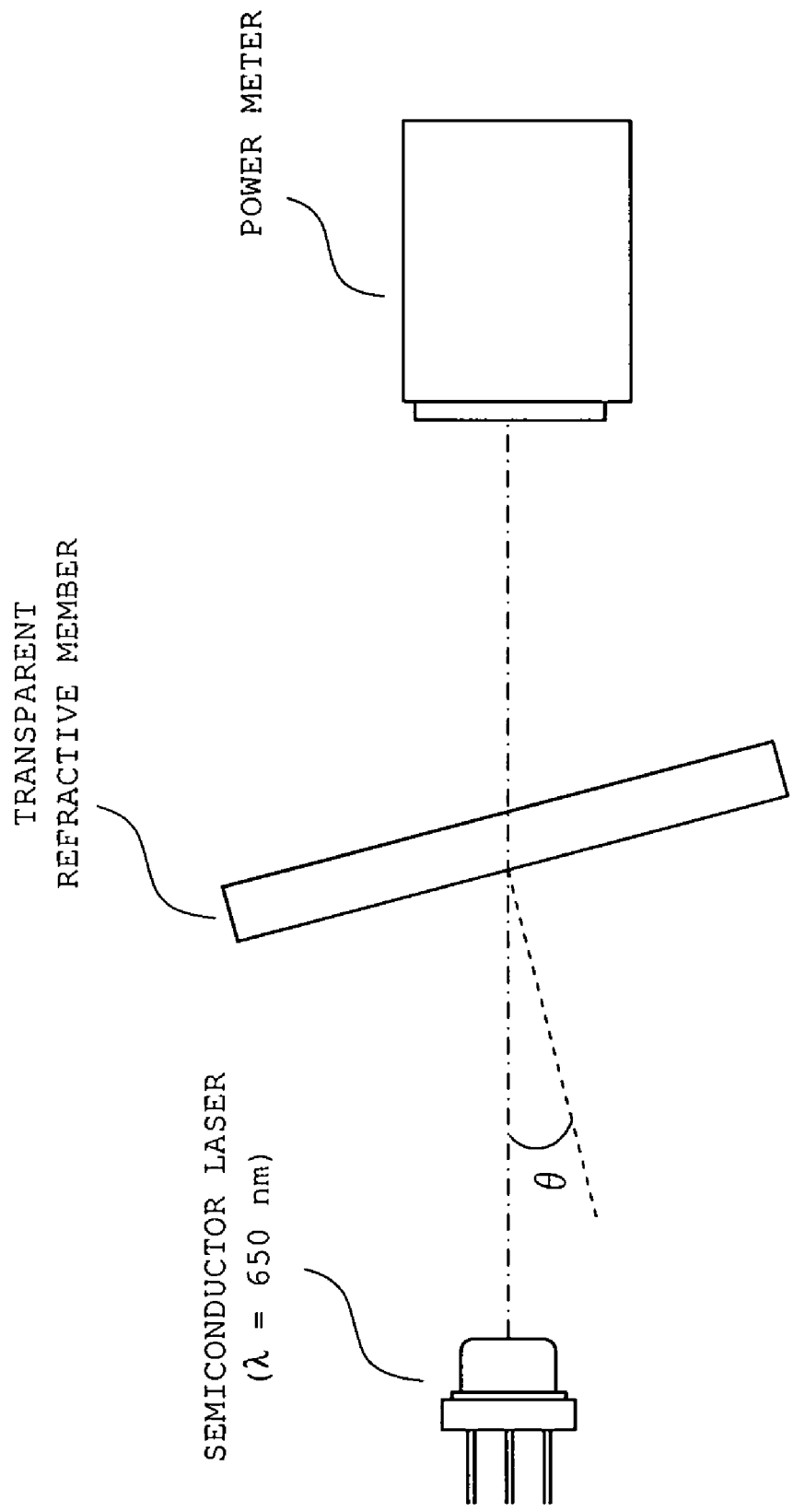
FIG. 18 is a diagram illustrating a measuring method of a verification example in the second embodiment.

FIG. 18 is a diagram showing a measuring method in the verification. In the verification, a semiconductor laser for emitting a laser beam having a wavelength of 650 nm was used as the servo beam light source. As a sample to be verified (transparent refractive body), the transparent member 200 (the example sample) of the embodiment, a transparent member (comparative sample 1) having a parallel plate shape in which the periodic structure 201 is not formed, and a transparent member in which a multilayer anti reflection film is disposed on both of the incidence plane and the outgoing plane (comparative example 2) were prepared. The transparent refractive body was tilted in one direction from a state where the incidence plane and the outgoing plane are perpendicular to the laser beam axis, and the amount of light passing through the transparent refractive body was measured at each of the tilt angles.

The measurement parameters were as follows.
a. Comparative Sample 1
   material: polycarbonate (refractive index: 1.58)
   thickness: 1 mm
b. Comparative Sample 2
   material: polycarbonate (refractive index: 1.58)
   thickness: 1 mm
   incidence plane: a multilayer anti reflection film (NOF Corporation, model number 8201UV) is attached
   outgoing plane: a multilayer anti reflection film (NOF Corporation, model number 8201UV) is attached
c. Example Sample
   material: polycarbonate (refractive index: 1.58)
   thickness: 1 mm
   incidence plane: a periodic structure having a pitch of 300 nm and an aspect ratio of 1.52 is formed
   outgoing plane: a periodic structure having a pitch of 300 nm and an aspect ratio of 1.52 is formed The periodic structure in the example sample was formed by a 2P mold using an ultraviolet curable resin (having a refractive index of 1.52). The output powers of the servo beam semiconductor laser for samples were set to the same.

Figure 19:
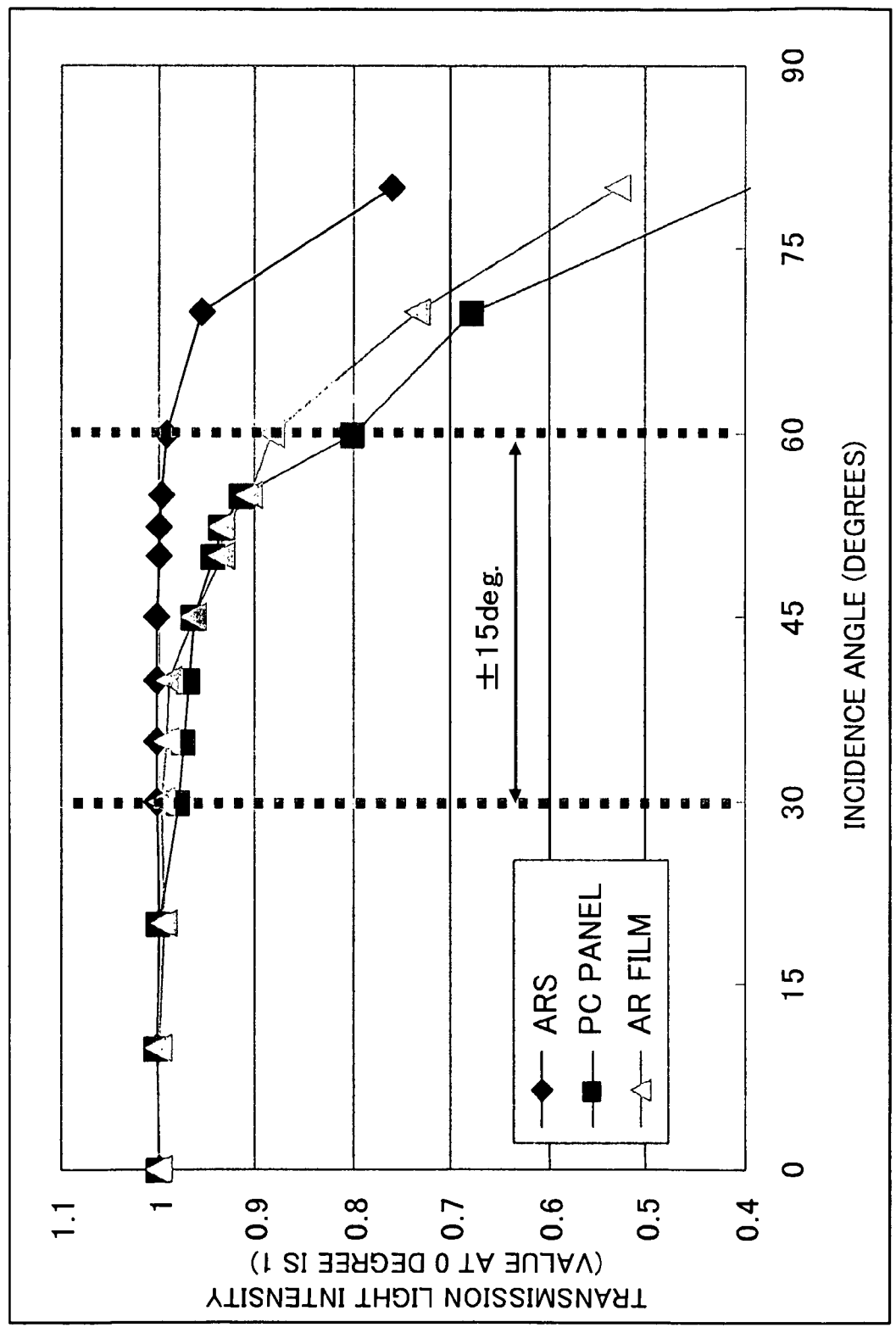
FIG. 19 shows a verification result of the second embodiment.

FIG. 19 shows a measurement result. The abscissa axis indicates the angle θ in FIG. 18, and the longitudinal axis indicates a measurement value of transmission light intensity in a power meter. In the longitudinal axis, the measurement value when the angle θ was zero is shown as 1. In FIG. 19, "ARS (Anti Reflection Structure)" shows a result of measurement on the example sample, "PC panel" shows a result of measurement on the comparative example 1, and "AR film" indicates a result of measurement on the comparative example 2. Dot lines show a deflection range (hereinbelow, called "detection range") of the transparent refractive body (the sample) when the mirror shifts from the neutral position in the range of +15 degrees in the horizontal direction (the shift angle=30 degrees).

It is understood from the measurement result that the transmission light intensity largely changes in the detection range in a case of using the comparative samples 1 and 2 as the transparent refractive body. Consequently, in this case, it is predicted that a large error component based on the change in the transmission light intensity is included in the position detection signal obtained by the equations (1) and (2) and the computation circuit in FIG. 17B.

In contrast, in a case of using the example sample as a transparent refractive body, the transmission light intensity hardly changes in the detection range. As concrete numerical values, the transmission light intensity at the incidence angle of 35 degrees is 1.00, the transmission light intensity at the incidence angle of 55 degrees is 0.99, and the difference between them is about 1%. Therefore, in the example sample, the error component based on the fluctuations in the transmission light intensity is not included in the position detection signal obtained by the equations (1) and (2) and the computation circuit of FIG. 17B. Consequently, it is assumed that the scan position of the laser beam in the target area can be detected with high precision.

As described above, according to the present embodiment, reflection of the servo beam is suppressed by the fine period structure 201. Consequently, even if the transparent member 200 turns as the mirror 113 turns, a large change does not occur in the reception amount of the servo beam in the PSD 306. Therefore, an error in the position detection signal output from the PSD 306 can be suppressed, and the scan position of the laser beam in the target area can be detected with high precision.

Although the second embodiment of the present invention has been described above, the present invention is not limited to the second embodiment. The present embodiment can be also variously modified in addition to those described above.

For example, in the second embodiment, the semiconductor laser is used as the servo beam light source. In place of the semiconductor laser, an LED (Light Emitting Diode) can be used.

Figure 20:
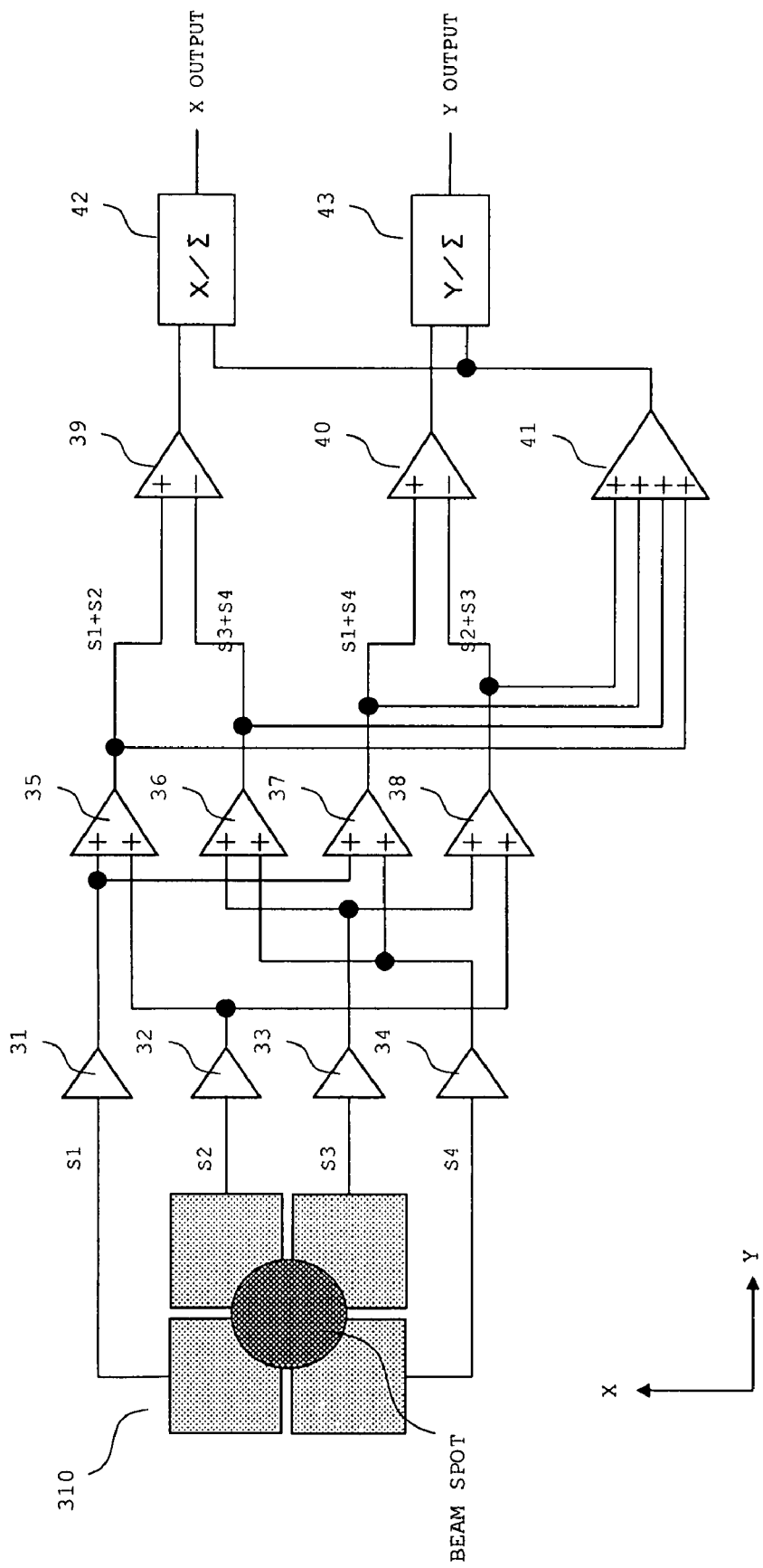
FIG. 20 shows a change example of a photodetector in the second embodiment.
Figures 21A, 21B:
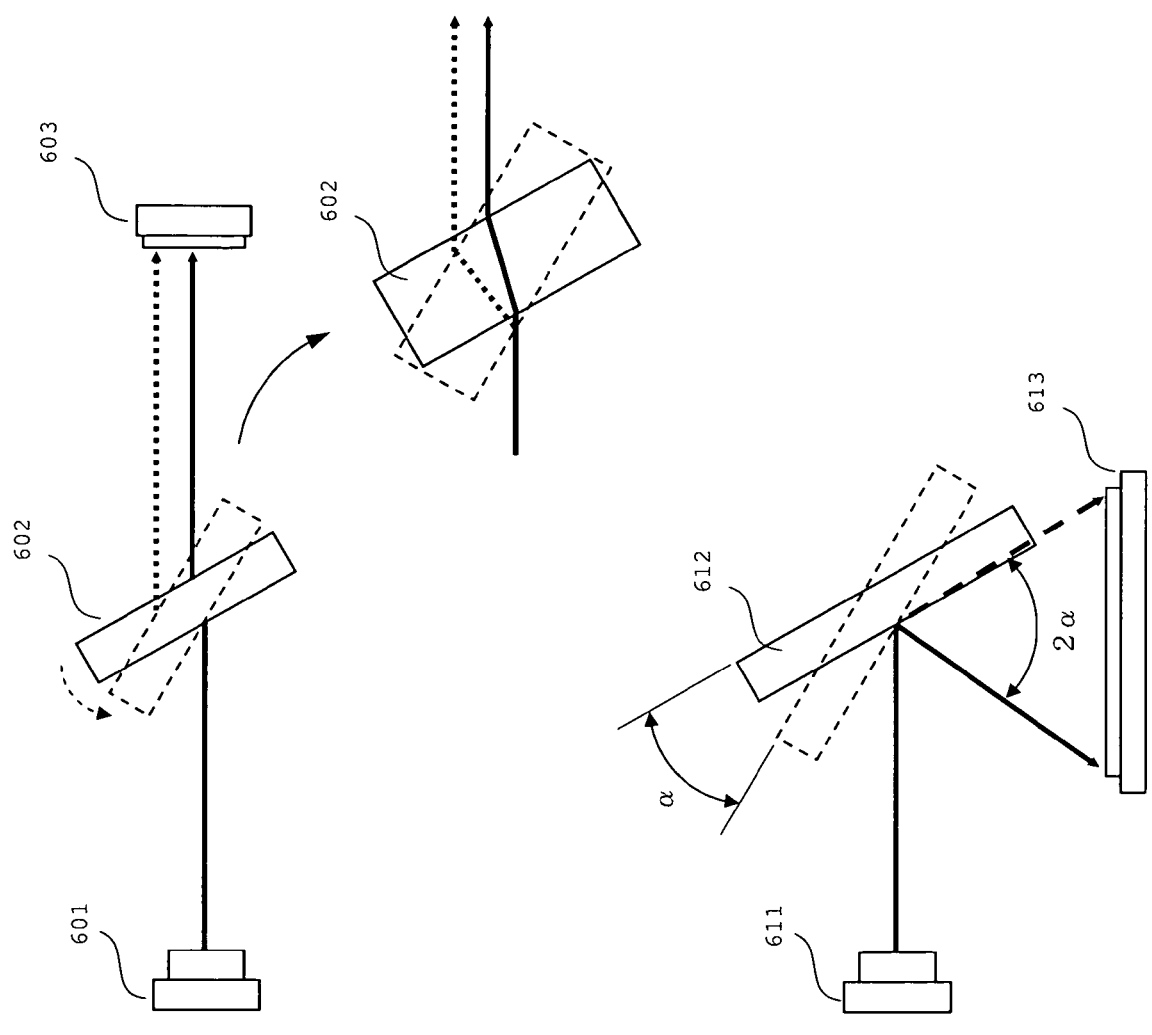
FIG. 21 is a diagram showing a position detecting method using a light refraction device and a mirror.

Although the PSD is used as a photodetector for receiving the servo beam in the second embodiment, as shown in FIG. 20, a quadrant sensor 310 can be used as the photodetector. In this case, when the mirror 113 is in the neutral position, the center position of the quadrant sensor 310 is irradiated with the servo beam. When output signals from the sensors are set as S1, S2, S3, and S4 as shown in the diagram, for example, the Y-direction position and the Y-direction position of a beam spot can be obtained by the following equations.

$$\frac{(S1+S2)-(S3+S4)}{S1+S2+S3+S4} = x \quad (3)$$

$$\frac{(S1+S4)-(S2+S3)}{S1+S2+S3+S4} = y \quad (4)$$

FIG. 20 shows the configuration of a computation circuit realizing the calculation equations. The signals S1, S2, S3, and S4 output from the sensors are amplified by amplifiers 31, 32, 33, and 34, respectively. Addition circuits 35, 36, 37, and 38 perform computation of (S1+S2), (S3+S4), (S1+S4), and (S2+S3), respectively. Subtraction circuits 39 and 40 execute computation of (S1+S2)−(S3+S4), and (S1+S4)−(S2+S3), respectively. Further, an addition circuit 41 performs computation of (S1+S2+S3+S4). Subtraction circuits 42 and 43 execute division on the left side of the equations (3) and (4). From the division circuits 41 and 42, position detection signals (outputs x and y) indicative of servo beam light reception positions in the x-direction and the y-direction position are output. Since the total amount light does not change, only the difference may be calculated as (S1+S2)−(S3+S4)=X and (S1+S4)−(S2+S3)=Y.

The embodiments of the present invention can be properly variously changed with the range of the technical idea described in the scope of the claims of the present invention.

What is claimed is:

1. A beam irradiation apparatus for scanning a target area with a laser beam, the apparatus comprising:
    a laser light source for emitting a laser beam;
    a mirror on which the laser beam emitted from the laser light source is incident;
    an actuator for turning the mirror in a first direction about a first axis and in a second direction about a second axis perpendicular to the first axis;
    a photorefractive element which is disposed in the actuator and turns in the first and second directions as the mirror turns;
    a servo beam source for emitting a servo beam which is used to detect a turning position of the mirror to the photorefractive element; and
    a photodetector for receiving the servo beam refracted by the photorefractive element and outputting a signal according to a light reception position, wherein
    the laser beam and the servo beam are incident on the mirror and the photorefractive element respectively so that an angle direction from an optical axis of the laser beam to be incident on the mirror to an incidence plane of the mirror and an angle direction from an optical axis of the servo beam to be incident on the photorefractive element to an incidence plane of the photorefractive element are opposite to each other.

2. The beam irradiation apparatus according to claim 1, wherein the photorefractive element is a transparent member whose incidence plane and whose outgoing plane are parallel to each other.

3. The beam irradiation apparatus according to claim 1, wherein when the mirror is in a neutral position, the servo beam is incident on the photorefractive element so that the optical axis of the servo beam is perpendicular to the first axis and has a tilt of 45 degrees or less with respect to the incidence plane of the photorefractive element.

4. The beam irradiation apparatus according to claim 3, wherein the servo beam is incident on the incidence plane of the photorefractive element at an angle where scan loci on the photodetector corresponding to a plurality of scan lines in the target area horizontally scanned with the laser beam become most parallel to each other.

5. The beam irradiation apparatus according to claim 1, wherein the laser beam is incident on the mirror so that the optical axis has a tilt of 45 degrees with respect to the incidence plane of the mirror when the mirror is in a neutral position.

* * * * *

UNITED STATES PATENT AND TRADEMARK OFFICE
CERTIFICATE OF CORRECTION

PATENT NO. : 8,102,514 B2
APPLICATION NO. : 12/209815
DATED : January 24, 2012
INVENTOR(S) : Yoshiaki Maeno and Atsushi Yamaguchi Page 1 of 1

It is certified that error appears in the above-identified patent and that said Letters Patent is hereby corrected as shown below:

In the drawings, FIG. 10, the lines for "0 DEGREE" and "+10 DEGREES" need to be properly shown in the graph and legend as follows:

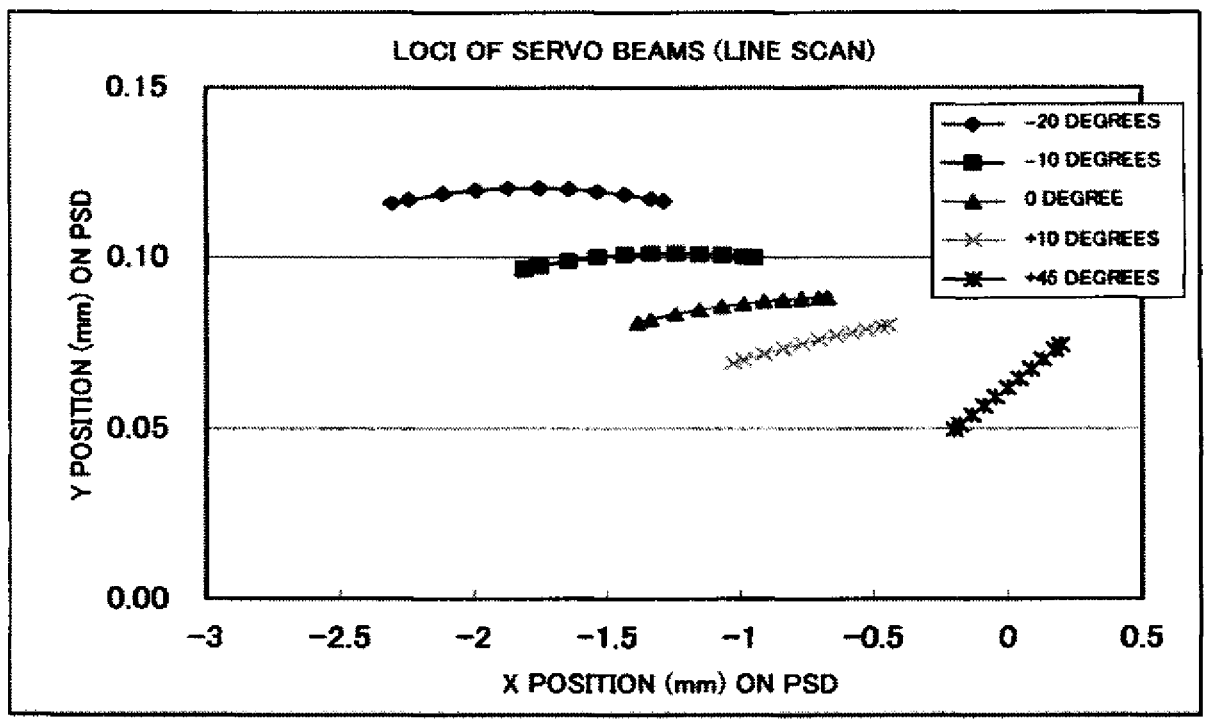

Signed and Sealed this
Fourth Day of December, 2012

David J. Kappos
*Director of the United States Patent and Trademark Office*